United States Patent
Shin et al.

(10) Patent No.: US 11,405,013 B2
(45) Date of Patent: Aug. 2, 2022

(54) BULK ACOUSTIC WAVE RESONATOR STRUCTURE FOR SECOND HARMONIC SUPPRESSION

(71) Applicant: Skyworks Global Pte. Ltd., Singapore (SG)

(72) Inventors: Kwang Jae Shin, Yongin-si (KR); Renfeng Jin, Irvine, CA (US); Li Chen, Irvine, CA (US)

(73) Assignee: Skyworks Global Pte. Ltd., Singapore (SG)

( * ) Notice: Subject to any disclaimer, the term of this patent is extended or adjusted under 35 U.S.C. 154(b) by 0 days.

(21) Appl. No.: 16/801,602

(22) Filed: Feb. 26, 2020

(65) Prior Publication Data

US 2020/0274515 A1 Aug. 27, 2020

Related U.S. Application Data

(60) Provisional application No. 62/811,154, filed on Feb. 27, 2019, provisional application No. 62/811,196, filed on Feb. 27, 2019.

(51) Int. Cl.
*H03H 9/02* (2006.01)
*H03H 9/205* (2006.01)
(Continued)

(52) U.S. Cl.
CPC .... *H03H 9/02086* (2013.01); *H03H 9/02015* (2013.01); *H03H 9/02047* (2013.01); *H03H 9/0504* (2013.01); *H03H 9/131* (2013.01); *H03H 9/173* (2013.01); *H03H 9/205* (2013.01); *H03H 9/582* (2013.01); *H03H 9/605* (2013.01);
(Continued)

(58) Field of Classification Search
CPC ......... H03H 9/54–62; H03H 9/13–133; H03H 9/205
See application file for complete search history.

(56) References Cited

U.S. PATENT DOCUMENTS 6,262,637 B1 * 7/2001 Bradley ................. H03H 9/568
310/322
7,321,183 B2 1/2008 Ebuchi et al.
(Continued)

OTHER PUBLICATIONS

Ueda, et al., "A Circuit Model for Nonlinear Simulation of Radio-Frequency Filters Employing Bulk Acoustic Wave Resonators." IEEE 2008.

(Continued)

*Primary Examiner* — Dean O Takaoka
*Assistant Examiner* — Alan Wong
(74) *Attorney, Agent, or Firm* — Knobbe, Martens, Olson & Bear, LLP

(57) ABSTRACT

Embodiments of this disclosure relate to acoustic wave filters configured to filter radio frequency signals. An acoustic wave filter includes a first bulk acoustic wave resonator on a substrate, a second bulk acoustic wave resonator on the substrate, a conductor electrically connecting the first bulk acoustic wave resonator in anti-series with the second bulk acoustic wave resonator, and an air gap positioned between the conductor and a surface of the substrate. The air gap can reduce parasitic capacitance associated with the conductor. Acoustic wave filters disclosed herein can suppress a second harmonic.

20 Claims, 27 Drawing Sheets

(51) Int. Cl.
*H03H 9/60* (2006.01)
*H03H 9/58* (2006.01)
*H03H 9/70* (2006.01)
*H03H 9/05* (2006.01)
*H03H 9/13* (2006.01)
*H03H 9/17* (2006.01)
*H04B 1/00* (2006.01)

(52) U.S. Cl.
CPC ............ *H03H 9/703* (2013.01); *H03H 9/706* (2013.01); *H04B 1/0057* (2013.01); *H03H 2009/02173* (2013.01)

(56) References Cited

U.S. PATENT DOCUMENTS

| | | | |
|---|---|---|---|
| 7,391,285 B2 | 6/2008 | Larson, III et al. | |
| 7,443,270 B2* | 10/2008 | Motai | H03H 3/02 310/312 |
| 7,515,018 B2 | 4/2009 | Handtmann et al. | |
| 7,548,140 B2* | 6/2009 | Jamneala | H03H 9/581 310/357 |
| 8,441,328 B2 | 5/2013 | Shin | |
| 8,476,995 B2 | 7/2013 | Shin | |
| 8,648,671 B2* | 2/2014 | Son | H03H 9/564 333/133 |
| 8,896,395 B2* | 11/2014 | Burak | H03H 9/02086 333/187 |
| 9,571,064 B2* | 2/2017 | Burak | H03H 9/02086 |
| 10,177,736 B2* | 1/2019 | Ivira | H03H 9/173 |
| 10,256,788 B2* | 4/2019 | Azarnaminy | H03H 9/02118 |
| 10,263,587 B2 | 4/2019 | Patil et al. | |
| 10,396,759 B2* | 8/2019 | Irieda | H03H 9/568 |
| 2007/0200146 A1 | 8/2007 | Onishi et al. | |
| 2008/0061907 A1 | 3/2008 | Lee et al. | |
| 2009/0134957 A1 | 5/2009 | Shin | |
| 2016/0191015 A1* | 6/2016 | Ivira | H03H 9/584 333/190 |
| 2020/0274520 A1 | 8/2020 | Shin et al. | |

OTHER PUBLICATIONS

Wang, et al., "A High-Frequency-Compatible Miniaturized Bandpass Filter with Air-Bridge Structures Using GaAs-Based Integrated Passive Device Technology," Micromachines, 2018, 9, 463, Published Sep. 13, 2018.
Yang, et al., "An H2 Emissions Model for Piezoelectric Devices Exhibiting Strong Lateral Mode Resonances," IEEE, 2017.
Craven, "What is the 5G spectrum? Definition", sdx central, published on Jan. 18, 2020, updated Sep. 2020.
Gheorghe et al., "Circuit Models for Anti-series and Anti-parallel Connections of Power BAW Resonators", IEEE Conference Paper, Nov. 2008.

* cited by examiner

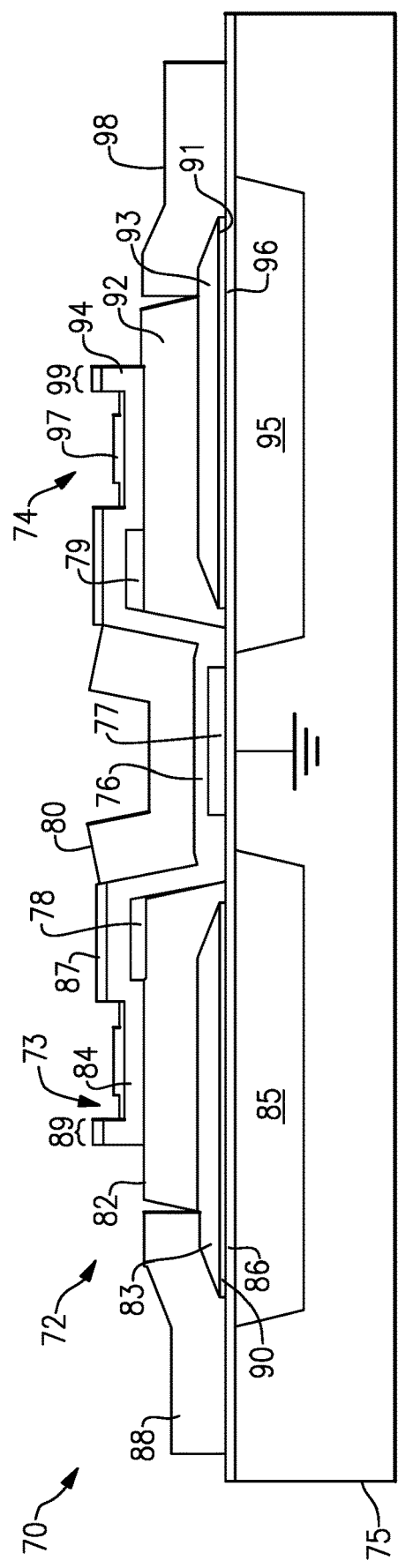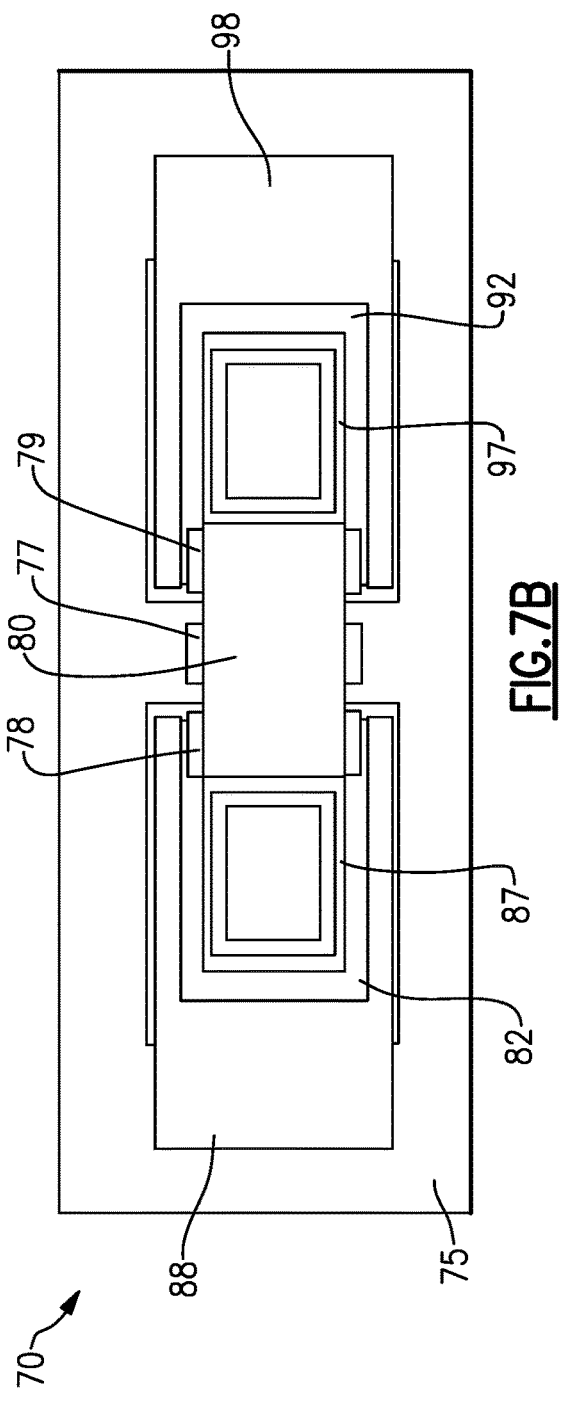

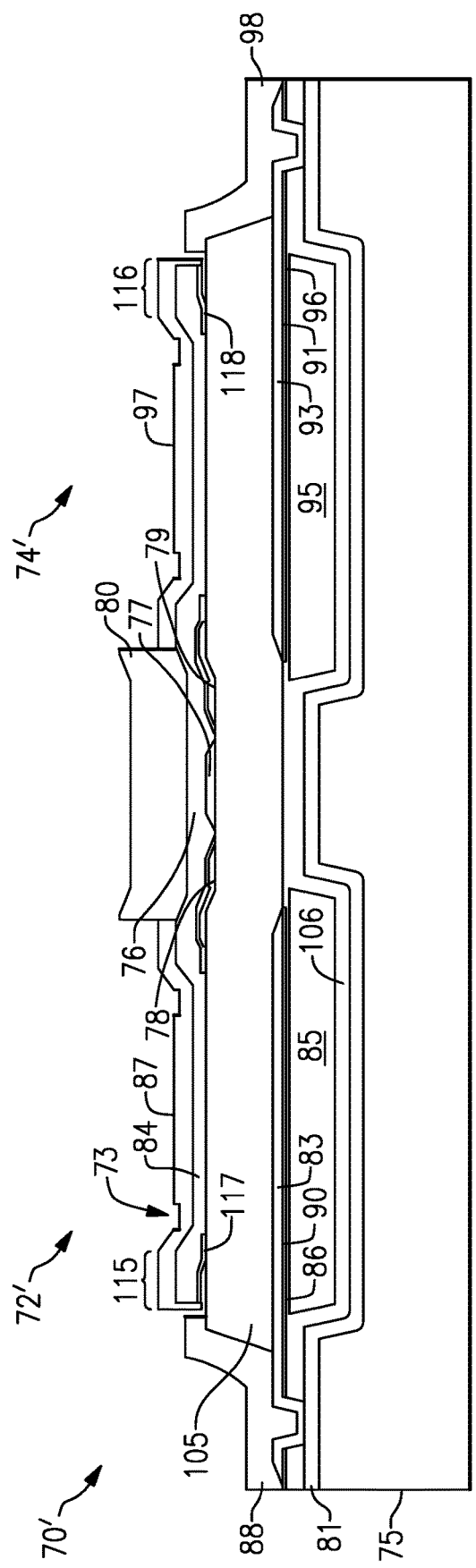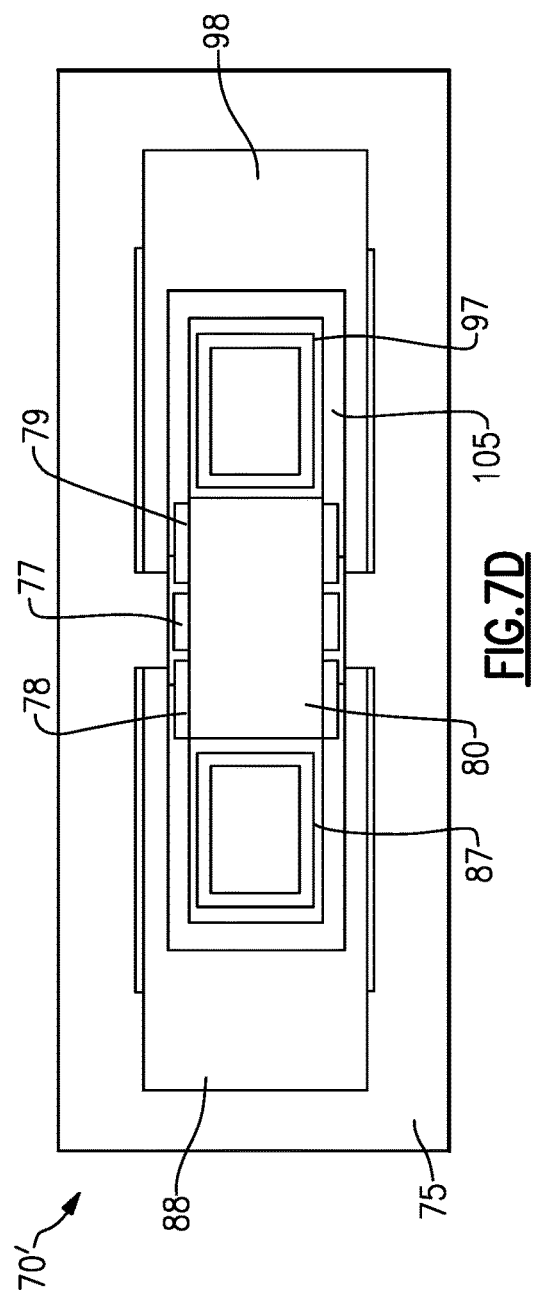

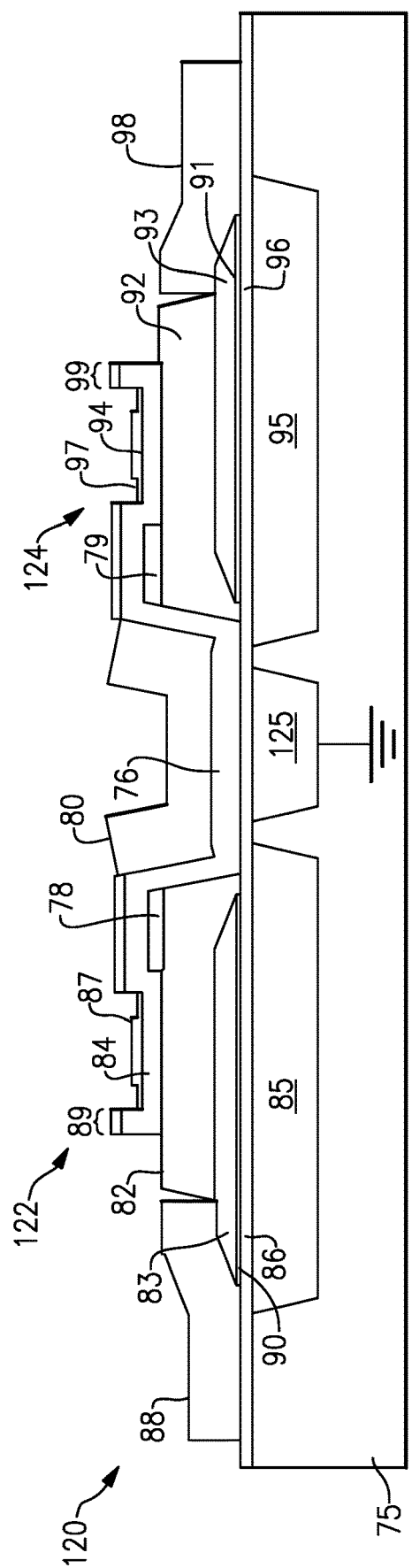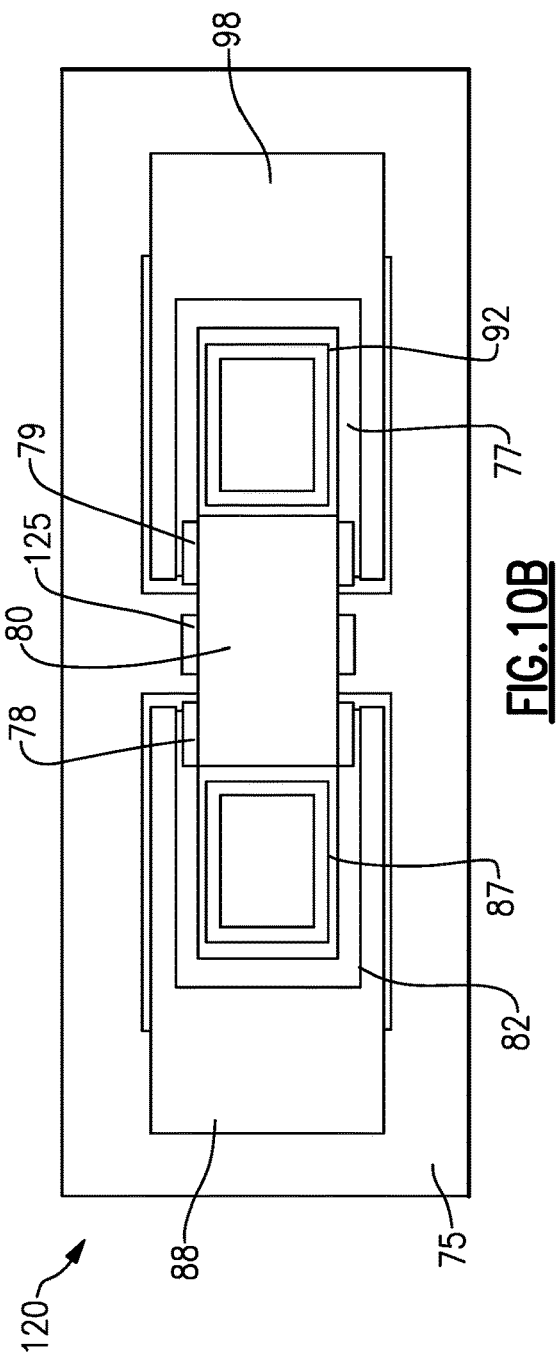

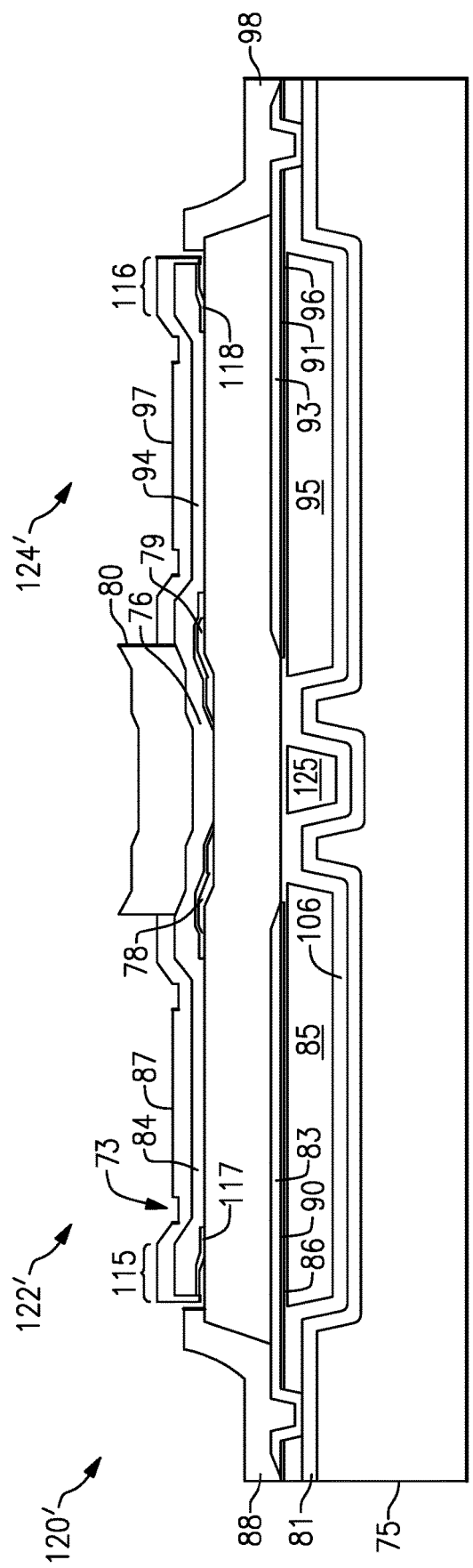
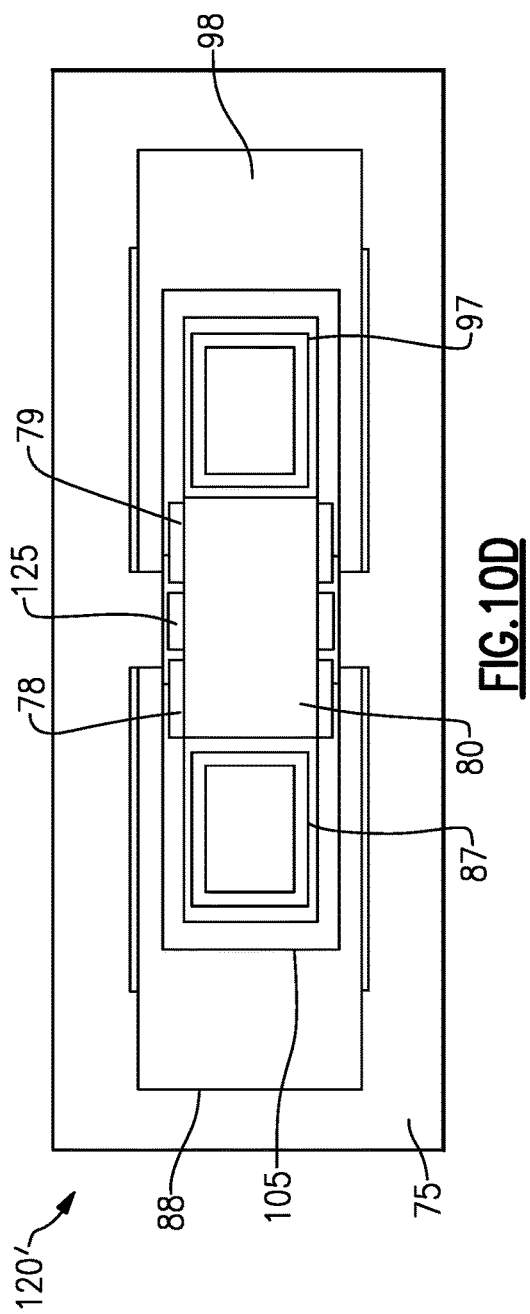
FIG.10C
FIG.10D

BULK ACOUSTIC WAVE RESONATOR STRUCTURE FOR SECOND HARMONIC SUPPRESSION

CROSS REFERENCE TO PRIORITY APPLICATIONS

This application claims the benefit of priority of U.S. Provisional Patent Application No. 62/811,196, filed Feb. 27, 2019 and titled "BULK ACOUSTIC WAVE RESONATOR STRUCTURE FOR SECOND HARMONIC SUPPRESSION," and also claims the benefit of priority of U.S. Provisional Patent Application No. 62/811,154, filed Feb. 27, 2019 and titled "BULK ACOUSTIC WAVE RESONATOR STRUCTURE," the disclosures of each which are hereby incorporated by reference in their entireties herein.

BACKGROUND

Technical Field

Embodiments of this disclosure relate to bulk acoustic wave resonators and/or bulk acoustic wave devices.

Description of Related Technology

Acoustic wave filters can be implemented in radio frequency electronic systems. For instance, filters in a radio frequency front end of a mobile phone can include one or more acoustic wave filters. A plurality of acoustic wave filters can be arranged as a multiplexer. For instance, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and solidly mounted resonators (SMRs). In BAW resonators, acoustic waves propagate in a bulk of a piezoelectric layer. BAW resonators can be nonlinear at high power levels. Reducing and/or eliminating such nonlinearities is generally desirable.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave filter with second harmonic suppression. The acoustic wave filter is configured to filter a radio frequency signal. The acoustic wave filter includes a first bulk acoustic wave resonator on a substrate, a second bulk acoustic wave resonator on the substrate, a conductor electrically connecting the first bulk acoustic wave resonator in anti-series with the second bulk acoustic wave resonator, and an air gap positioned between the conductor and a surface of the substrate.

The first bulk acoustic wave resonator can be a first film bulk acoustic wave resonator. The second bulk acoustic wave resonator can be a second film bulk acoustic wave resonator. The air gap can be an air cavity for the first film bulk acoustic wave resonator and the second film bulk acoustic wave resonator.

The air gap can be an air cavity in the substrate. The air gap can be an air cavity positioned between a layer of piezoelectric material and the substrate.

The air gap can be an air bridge over the substrate. The air gap can be an air bridge positioned between a layer of piezoelectric material and the conductor.

The acoustic wave filter can further include a second air gap positioned between the conductor and the substrate. The air gap can be an air cavity, and the second air gap can be an air bridge.

The first bulk acoustic wave resonator can be a first solidly mounted resonator. The second bulk acoustic wave resonator can be a second solidly mounted resonator.

The acoustic wave filter can be a transmit filter having an antenna port. The first bulk acoustic wave resonator and the second bulk acoustic wave resonator can be coupled between all other series bulk acoustic wave resonators of the acoustic wave filter and the antenna port.

The first bulk acoustic wave resonator can include a multi-layer raised frame structure. The first bulk acoustic wave resonator can include a recessed frame structure.

The acoustic wave filter can be included in a wireless communication device that also includes an antenna in communication with the acoustic wave filter.

Another aspect of this disclosure is a multiplexer arranged to filter radio frequency signals. The multiplexer includes a first acoustic wave filter configured to filter a first radio frequency signal and a second acoustic wave filter configured to filter a second radio frequency signal. The second acoustic wave filter is coupled to the first acoustic wave filter at a common node of the multiplexer. The first acoustic wave filter includes a first bulk acoustic wave resonator on a substrate, a second bulk acoustic wave resonator on the substrate, a conductor electrically connecting the first bulk acoustic wave resonator in anti-series with the second bulk acoustic wave resonator, and an air gap positioned between the conductor and a surface of the substrate.

The first acoustic wave filter can include any suitable features of the acoustic wave filters disclosed herein. For example, the first acoustic wave resonator can be a film bulk acoustic wave resonator. As another example, the first bulk acoustic wave resonator can include a multi-layer raised frame structure. The second acoustic wave filter can include any suitable features of the acoustic wave filters disclosed herein.

The multiplexer can further include a third acoustic wave filter configured to filter a third radio frequency signal. The third acoustic wave filter can be coupled to both the first acoustic wave filter and the second acoustic wave filter at the common node.

Another aspect of this disclosure is a method of filtering a radio frequency signal with second harmonic suppression. The method includes providing a radio frequency signal to an acoustic wave filter that includes an air gap between a conductor of the acoustic wave filter and a substrate, the conductor electrically connecting a first bulk acoustic wave resonator of the acoustic wave filter in anti-series with a second bulk acoustic wave resonator of the acoustic wave filter, and the first bulk acoustic wave resonator and the second bulk acoustic wave resonator both being on the substrate; and filtering the radio frequency signal with the acoustic wave filter so as to provide second harmonic suppression.

The acoustic wave filter can include any suitable features of the acoustic wave filters disclosed herein.

The acoustic wave filter can be a transmit filter. The transmit filter can have an antenna port. The first bulk acoustic wave resonator and the second bulk acoustic wave resonator can be coupled between all other series bulk acoustic wave resonators of the acoustic wave filter and the antenna port. The transmit filter can be included in a multiplexer. The transmit filter can be coupled to a receive filter of the multiplexer at a common node of the multiplexer.

Another aspect of this disclosure is an acoustic wave component that includes a first bulk acoustic wave resonator on a substrate, a second bulk acoustic wave resonator on the substrate, a conductor electrically connecting the first bulk acoustic wave resonator to the second bulk acoustic wave resonator, and an air gap positioned between the conductor and a surface of the substrate. The first bulk acoustic wave resonator includes a first electrode, a second electrode, a piezoelectric layer positioned between the first electrode and the second electrode, and a multi-layer raised frame structure. The multi-layer raised frame structure includes a layer positioned between the piezoelectric layer and the first electrode.

The conductor can electrically connect the first bulk acoustic wave resonator in anti-series with the second bulk acoustic wave resonator.

The first bulk acoustic wave resonator can be a first film bulk acoustic wave resonator, and the second bulk acoustic wave resonator can be a second film bulk acoustic wave resonator. The air gap can be an air cavity for the first film bulk acoustic wave resonator and the second film bulk acoustic wave resonator.

The air gap can be an air cavity in the substrate. The air gap can be positioned between a layer of piezoelectric material and the substrate.

The air gap can be an air bridge over a surface of the substrate closest to a piezoelectric layer of the first bulk acoustic wave resonator. The air gap can be an air bridge positioned between a layer of piezoelectric material and the conductor.

The layer of the multi-layer raised frame structure can be a silicon dioxide layer.

The first bulk acoustic wave resonator can include a recessed frame structure.

The second bulk acoustic wave resonator can include a second multi-layer raised frame structure.

Another aspect of this disclosure is a front end module that includes an acoustic wave filter and a radio frequency switch coupled to a port of the acoustic wave filter. The radio frequency switch is configured to pass a radio frequency signal. The acoustic wave filter includes a first bulk acoustic wave resonator having a multi-layer raised frame structure and is on a substrate, a second bulk acoustic wave resonator on the substrate, a conductor electrically connecting the first bulk acoustic wave resonator to the second bulk acoustic wave resonator, and an air gap positioned between the conductor and a surface of the substrate.

The front end module can further include a radio frequency amplifier. The radio frequency switch can be configured to selectively electrically connect the radio frequency amplifier and the acoustic wave filter.

The acoustic wave filter can be configured to filter fifth generation New Radio signal within a frequency band in Frequency Range 1.

The conductor can electrically connect the first bulk acoustic wave resonator in anti-series with the second bulk acoustic wave resonator.

The acoustic wave filter can be a transmit filter having an antenna port. The first bulk acoustic wave resonator and the second bulk acoustic wave resonator can be coupled between all other series bulk acoustic wave resonators of the acoustic wave filter and the antenna port.

Another aspect of this disclosure is a wireless communication device that includes an antenna and a radio frequency front end in communication with the antenna. The radio frequency front end includes an acoustic wave filter. The acoustic wave filter includes a first bulk acoustic wave resonator having a multi-layer raised frame structure and that is on a substrate, a second bulk acoustic wave resonator on the substrate, a conductor electrically connecting the first bulk acoustic wave resonator to the second bulk acoustic wave resonator, and an air gap positioned between the conductor and a surface of the substrate.

The conductor can electrically connect the first bulk acoustic wave resonator in anti-series with the second bulk acoustic wave resonator. The acoustic wave filter can be a transmit filter having an antenna port. The first bulk acoustic wave resonator and the second bulk acoustic wave resonator can be coupled between all other series bulk acoustic wave resonators of the acoustic wave filter and the antenna port.

The wireless communication device can be a mobile phone.

Another aspect of this disclosure is an acoustic wave component that includes a first bulk acoustic wave resonator on a substrate, a second bulk acoustic wave resonator on the substrate, a conductor electrically connecting the first bulk acoustic wave resonator in anti-series with the second bulk acoustic wave resonator, and an air gap positioned between the conductor and a surface of the substrate.

The first bulk acoustic wave resonator can be a first film bulk acoustic wave resonator, and the second bulk acoustic wave resonator can be a second film bulk acoustic wave resonator. The air gap can be an air cavity for the first film bulk acoustic wave resonator and the second film bulk acoustic wave resonator.

The air gap can be an air cavity in the substrate. The air gap can be an air cavity positioned between a layer of piezoelectric material and the substrate.

The air gap can be an air bridge over the substrate. The air gap can be an air bridge positioned between a layer of piezoelectric material and the conductor.

The acoustic wave component can further include a second air gap positioned between the conductor and the substrate. In some such instances, the air gap can be an air cavity and the second air gap can be an air bridge.

The first bulk acoustic wave resonator can be a first solidly mounted resonator, and the second bulk acoustic wave resonator can be a second solidly mounted resonator.

Another aspect of this disclosure is an acoustic wave component that includes a first bulk acoustic wave resonator on a substrate, a second bulk acoustic wave resonator on the substrate, a conductor electrically connecting the first bulk acoustic wave resonator in anti-series with the second bulk acoustic wave resonator, and a low-k dielectric positioned between the conductor and a surface of the substrate.

The low-k dielectric can include air.

Another aspect of this disclosure is an acoustic wave filter with second harmonic suppression. The acoustic wave filter includes a first bulk acoustic wave resonator, a second bulk acoustic wave resonator vertically integrated with the first bulk acoustic wave resonator, a conductor electrically connecting the first bulk acoustic wave resonator in anti-series with the second bulk acoustic wave resonator, and an air gap positioned between the first bulk acoustic wave resonator and the second bulk acoustic wave resonator. The air gap is arranged to reduce parasitic capacitance associated with the conductor, and the acoustic wave filter configured to filter a radio frequency signal.

The air gap can be an air cavity.

The first bulk acoustic wave resonator can be a first film bulk acoustic wave resonator, and the second bulk acoustic wave resonator can be a second film bulk acoustic wave resonator.

The air gap can be positioned between a first electrode of the first bulk acoustic wave resonator and a second electrode of the second bulk acoustic wave resonator. The acoustic wave filter can further include passivation material over the first electrode of the first bulk acoustic wave resonator. The air gap can be located between the passivation material and the second electrode of the second bulk acoustic wave resonator.

The conductor can electrically connect the first bulk acoustic wave resonator with the second bulk acoustic wave resonator on opposing sides of the air gap.

The first bulk acoustic wave resonator can be over a substrate, the air gap can be over the first bulk acoustic wave resonator, and the second bulk acoustic wave resonator can be over the air gap. The acoustic wave filter can further include an air cavity in the substrate under the first bulk acoustic wave resonator.

The acoustic wave filter can be a transmit filter having an antenna port. The first bulk acoustic wave resonator and the second bulk acoustic wave resonator can be coupled between all other bulk acoustic wave resonators of the acoustic wave filter and the antenna port.

The acoustic wave filter can be included in a wireless communication device that includes an antenna in communication with the acoustic wave filter.

Another aspect of this disclosure is an acoustic wave component that includes a first bulk acoustic wave resonator, a second bulk acoustic wave resonator vertically integrated with the first bulk acoustic wave resonator, a conductor electrically connecting the first bulk acoustic wave resonator in anti-series with the second bulk acoustic wave resonator, and a low-k dielectric positioned between the first bulk acoustic wave resonator and the second bulk acoustic wave resonator. The low-k dielectric is arranged to reduce parasitic capacitance associated with the conductor.

The low-k dielectric can be air. The low-k dielectric can be in an air cavity.

The first bulk acoustic wave resonator can be a first film bulk acoustic wave resonator, and the second bulk acoustic wave resonator can be a second film bulk acoustic wave resonator.

Another aspect of this disclosure is a multiplexer arranged to filter radio frequency signals. The multiplexer includes a first acoustic wave filter configured to filter a first radio frequency signal and a second acoustic wave filter configured to filter a second radio frequency signal. The second acoustic wave filter is coupled to the first acoustic wave filter at a common node of the multiplexer. The first acoustic wave filter includes a first bulk acoustic wave resonator, a second bulk acoustic wave resonator vertically integrated with the first bulk acoustic wave resonator, a conductor electrically connecting the first bulk acoustic wave resonator in anti-series with the second bulk acoustic wave resonator, and an air gap arranged to reduce parasitic capacitance associated with the conductor.

The first acoustic wave filter can further include one or more suitable features of the acoustic wave filters disclosed herein. The second acoustic wave filter can further include one or more suitable features of the acoustic wave filters disclosed herein.

The multiplexer can further include a third acoustic wave filter configured to filter a third radio frequency signal. The third acoustic wave filter can be coupled to both the first acoustic wave filter and the second acoustic wave filter at the common node.

Another aspect of this disclosure is a method of filtering a radio frequency signal with second harmonic suppression. The method includes providing a radio frequency signal to an acoustic wave filter that includes an air gap between a first bulk acoustic wave resonator and a second bulk acoustic wave resonator, the first bulk acoustic wave resonator and the second bulk acoustic wave resonator electrically connected in anti-series with each other by a conductor, and the air gap arranged to reduce parasitic capacitance associated with the conductor; and filtering the radio frequency signal with the acoustic wave filter so as to provide second harmonic suppression.

The acoustic wave filter can further include one or more suitable features of any of the acoustic wave filters disclosed herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 16/801,768, titled "BULK ACOUSTIC WAVE RESONATOR STRUCTURE," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 7A is a cross sectional view of an acoustic wave component that includes anti-series BAW resonators with an air bridge below a conductor electrically connecting the anti-series BAW resonators according to an embodiment.

FIG. 7B is a plan view of the anti-series BAW resonators of FIG. 7A.

FIG. 7C is a cross sectional view of an acoustic wave component that includes anti-series BAW resonators with an air bridge below a conductor electrically connecting the anti-series BAW resonators according to another embodiment.

FIG. 7D is a plan view of the anti-series BAW resonators of FIG. 7C.

FIG. 10A is a cross sectional view of an acoustic wave component that includes anti-series BAW resonators with an air cavity below a conductor electrically connecting the anti-series BAW resonators according to an embodiment.

FIG. 10B is a plan view of the anti-series BAW resonators of FIG. 10A.

FIG. 10C is a cross sectional view of an acoustic wave component that includes anti-series BAW resonators with an air cavity below a conductor electrically connecting the anti-series BAW resonators according to another embodiment.

FIG. 10D is a plan view of the anti-series BAW resonators of FIG. 10C.

DETAILED DESCRIPTION OF CERTAIN EMBODIMENTS

Figure 1:
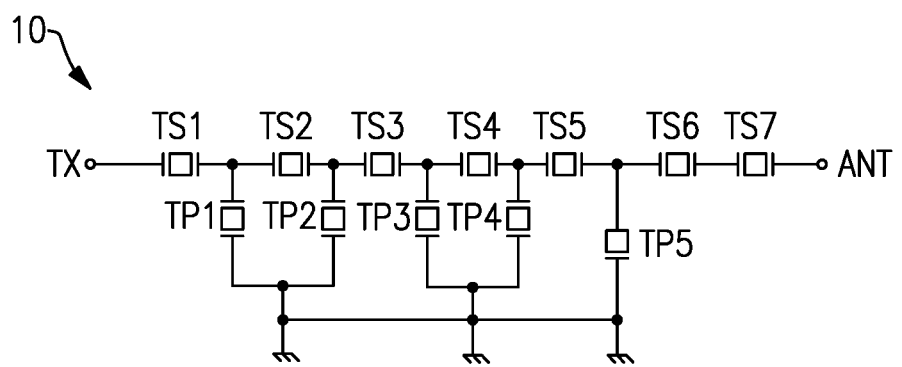
FIG. 1 is a schematic diagram of a transmit filter that includes anti-series bulk acoustic wave (BAW) resonators according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Bulk acoustic wave (BAW) resonators can begin to show non-linearity with high power signals, particularly in the presence of high power transmitter signals in applications related to wireless communications. Emission of harmonics is a problem that can be caused by non-linearity. A transmit filter can generate an unwanted second order harmonic (2H) at certain frequencies that can enter the pass band of a receiver path connected to the same antenna port as the transmit filter. If the second order harmonic is strong, the receiver can be desensitized. From measurement data, strong second order harmonics have been observed in a film bulk acoustic wave resonator (FBAR) filter in a triplexer. Suppressing the second order harmonic would be desirable.

Electrically connecting FBARs together in anti-series with each other can suppress second order harmonics. Anti-series FBARs are FBARs that are connected in series with each other with their polarities reversed. The parasitic capacitance associated with the anti-series connection can impact suppression of second order harmonics. Aspects of this disclosure relate to reducing and/or eliminating this parasitic capacitance with an air gap. For example, the air gap can include an air bridge underneath a connection wire between two FBARs arranged in anti-series with each other. As another example, a dedicated air cavity in a carrier substrate can be underneath a connection wire between two FBARs arranged in anti-series with each other. As another example, a common air cavity can be formed under two FBARs arranged in anti-series with each other and the connection wire between the two FBARs. The two anti-series FBARs can share an air cavity to reduce wiring length or the anti-series connection. Any other suitable low k dielectric can be implemented in place of or in addition to an air gap to reduce parasitic capacitance associated with a connection between two bulk acoustic wave resonators connected in anti-series with each other.

In certain instances, parasitic capacitance can limit second harmonic cancellation of two anti-series BAW resonators electrically connected to each other by a conductor. Including an air gap positioned between the conductor and a surface of a carrier substrate of the BAW resonators can reduce and/or eliminate the parasitic effect on second harmonic cancellation. This can improve second harmonic suppression. Second harmonic suppression can contribute to overall linearity of a filter that includes the anti-series BAW resonators. A multiplexer, such as a duplexer or a triplexer, including such a filter can meet stringent harmonic and/or intermodulation distortion specifications.

FIG. 1 is a schematic diagram of a transmit filter 10 that includes anti-series bulk acoustic wave (BAW) resonators according to an embodiment. The transmit filter 10 is a ladder filter. The transmit filter 10 is a band pass filter arranged to filter a radio frequency signal. As illustrated, the transmit filter 10 includes series BAW resonators TS1, TS2, TS3, TS4, TS5, TS6, TS7, and TS7 and shunt BAW resonators TP1, TP2, TP3, TP4, and TP5 coupled between a transmit port TX and an antenna port ANT. Any suitable number of series BAW resonators can be included in a transmit filter. Any suitable number of shunt BAW resonators can be included in a transmit filter. The series BAW resonators TS6 and TS7 are electrically connected in anti-series with each other. Two BAW resonators are electrically connected in anti-series with each other when they are connected in series with each other with their polarities reversed. The anti-series BAW resonators TS6 and TS7 can have approximately twice the area of an equivalent single BAW resonator. As shown in FIG. 1, all other series BAW resonators of the transmit filter 10 are coupled to the antenna port ANT by way of the anti-series BAW resonators TS6 and TS7. All other BAW resonators of the transmit filter 10 can be coupled to the antenna port ANT by way of the anti-series BAW resonators TS6 and TS7 as illustrated.

The anti-series connected BAW resonators TS6 and TS7 can provide harmonic suppression. Simulation results indicate that the anti-series BAW resonators TS6 and TS7 can cancel second harmonic power emissions (H2) by about 30 decibels (dB) (peak) in certain instances of the transmit filter 10. The remaining H2 is thought to be due to wiring parasitics.

Contributions of the series BAW resonators TS1 to TS7 were analyzed at the antenna port ANT for the transmit filter 10. The H2 contributions from later stages of series BAW resonators are generally greater than those from earlier stages of series BAW resonators. This can be due to H2 generated by an earlier stage series BAW resonator being at least partially rejected by BAW resonators of the later stages of the filter. The H2 contributed by series BAW resonators can dominate the H2 in the second half of the pass band of the transmit filter 10. The anti-series BAW resonators TS6 and TS7 can cancel H2 effectively. The H2 can be related to device size. A smaller BAW resonator can typically generate higher H2 than a larger BAW resonator.

Contributions of the shunt BAW resonators TP1 to TP5 were analyzed at the antenna port ANT for the transmit filter 10. The H2 contributions from later stages of shunt BAW resonators are generally greater than those from earlier stages of shunt BAW resonators. This can be due to H2 generated by an earlier stage shunt BAW resonator being at least partially rejected by BAW resonators of the later stages of the filter. The H2 contributed by shunt BAW resonators can dominate the H2 in the first half of the pass band of the transmit filter 10. The H2 can be related to device size. A smaller BAW resonator can typically generate higher H2 than a larger BAW resonator.

Figure 2:
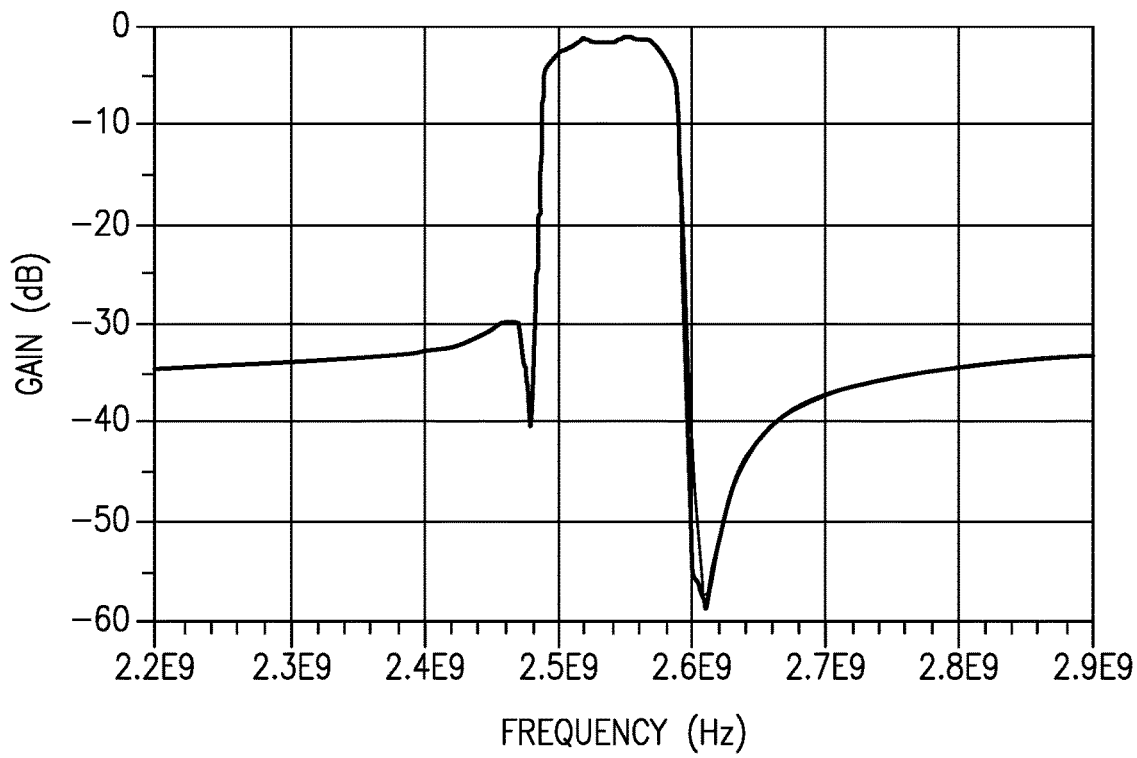
FIG. 2 is a graph of gain versus frequency for the transmit filter of FIG. 1.

FIG. 2 is a graph of gain versus frequency for the transmit filter 10 of FIG. 1. The BAW resonators of the transmit filter 10 together produce the grain curve shown in FIG. 2.

Figure 3:
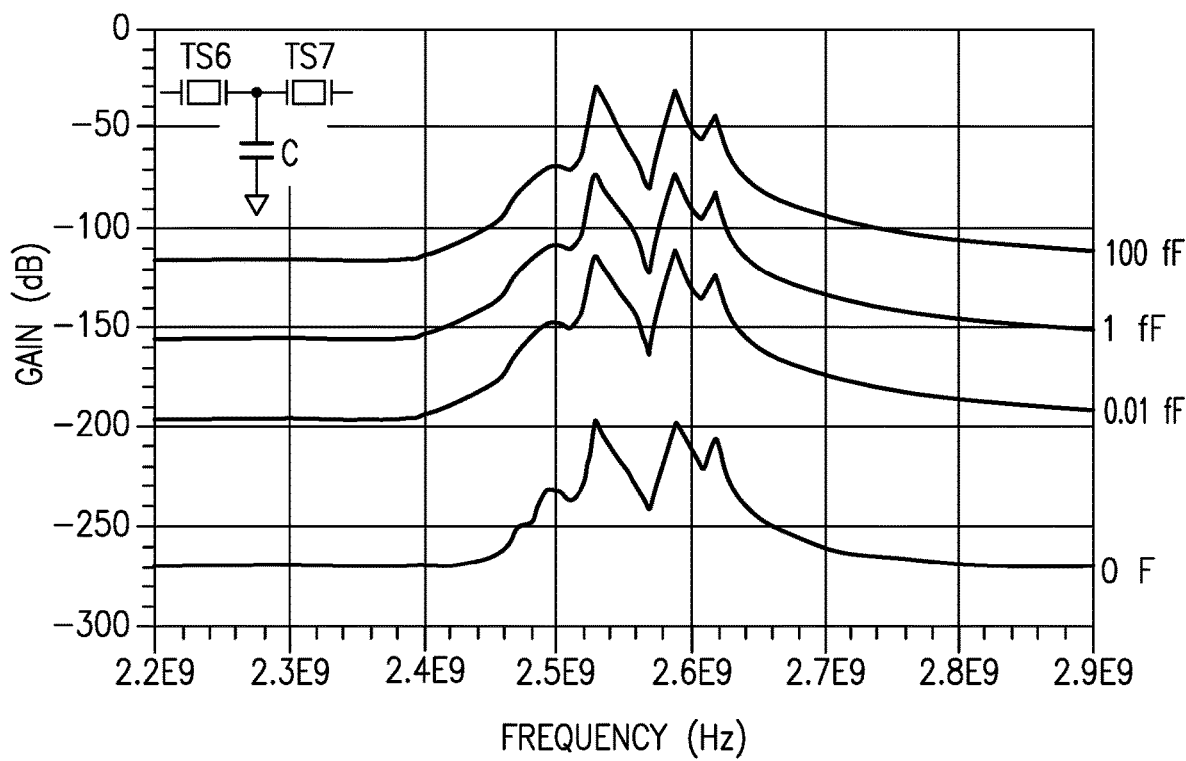
FIG. 3 is a graph of second harmonic power emissions versus frequency for various parasitic capacitances associated with the anti-series BAW resonators of the transmit filter of FIG. 1.

FIG. 3 is a graph of second harmonic power emissions versus frequency for various parasitic capacitances associated with the anti-series BAW resonators of the transmit filter of FIG. 1. In the curves should in FIG. 3, capacitive coupling to ground is added between the anti-series resonators TS6 and TS7 of the transmit filter 10. The curves shown in FIG. 3 correspond to parasitic capacitances of 0 Farads (F), 0.01 femtofarads (fF), 1 fF, and 100 fF. FIG. 3 indicates that parasitic capacitance can have a significant impact on H2 suppression and/or cancellation. Accordingly, two anti-series BAW resonators with a low parasitic capacitance associated with an electrical connection between the two anti-series BAW resonators can be desirable.

Figure 4:
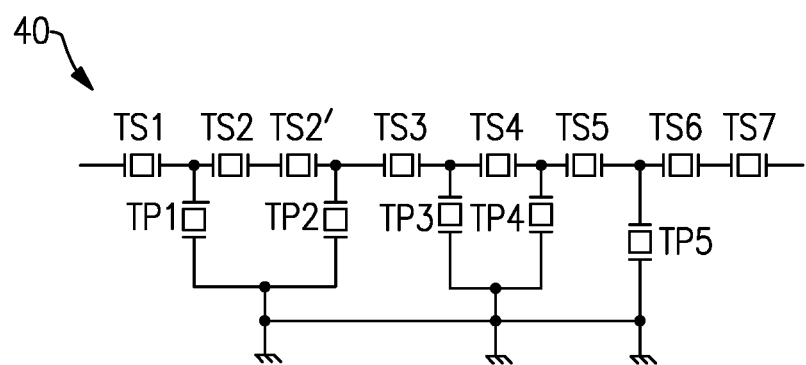
FIG. 4 is a schematic diagram of a transmit filter that includes more than one pair of anti-series BAW resonators according to an embodiment.

FIG. 4 is a schematic diagram of a transmit filter 40 that includes more than one pair of anti-series BAW resonators according to an embodiment. The transmit filter 40 is like the transmit filter 10 of FIG. 1 except that the series BAW resonator TS2 of the transmit filter 10 is replace with anti-series BAW resonators TS2 and TS2'. FIG. 4 illustrates that a pair anti-series BAW resonators can be included in various positions of a ladder filter. The transmit filter 40 also illustrates that more than one pair of anti-series BAW resonators can be included in an acoustic wave filter in certain applications.

Figure 5:
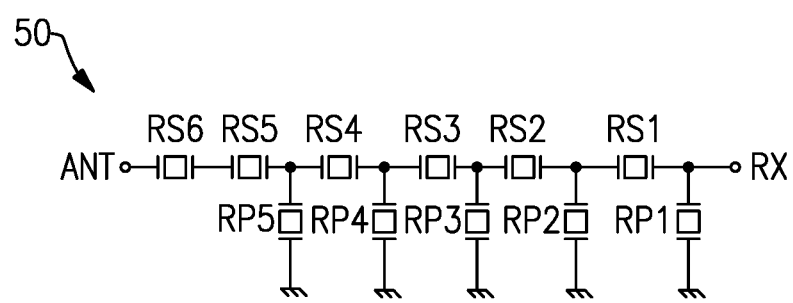
FIG. 5 is a schematic diagram of a receive filter that includes anti-series BAW resonators according to an embodiment.

FIG. 5 is a schematic diagram of a receive filter 50 that includes anti-series BAW resonators according to an embodiment. The receive filter 50 is a ladder filter. The receive filter 50 is a band pass filter arranged to filter a radio frequency signal. As illustrated, the receive filter 50 includes series BAW resonators RS1 to TS6 and shunt BAW resonators RP1 to RP5 coupled between a receive port TX and an antenna port ANT. Any suitable number of series BAW resonators can be in include in a receive filter. Any suitable number of shunt BAW resonators can be included in a receive filter. The series BAW resonators RS5 and RS6 are electrically connected in anti-series with each other. The anti-series BAW resonators RS5 and RS6 can provide harmonic suppression at the antenna port ANT. As shown in FIG. 5, all other series BAW resonators of the receive filter 50 are coupled to the antenna port ANT by way of the anti-series BAW resonators RS5 and RS6. All other BAW resonators of the receive filter 50 can be coupled to the antenna port ANT by way of the anti-series BAW resonators RS5 and RS6 as illustrated.

Although embodiments disclosed herein relate to ladder filters, any suitable principles and advantages disclosed herein can be applied to any other suitable filter topologies, such as lattice filters, hybrid ladder and lattice filters, and hybrid bulk acoustic wave resonator and inductor-capacitor (LC) filters.

The principles and advantages disclosed herein can be implemented in a standalone filter and/or in one or more filters in any suitable multiplexer. Such filters can be any suitable topology discussed herein, such as any filter topology in accordance with any suitable principles and advantages disclosed with reference to any of FIGS. 1, 4, and/or 5. The filter can be a band pass filter arranged to filter a fourth generation (4G) Long Term Evolution (LTE) band and/or fifth generation (5G) New Radio (NR) band. Examples of a standalone filter and multiplexers will be discussed with reference to FIGS. 6A to 6E. Any suitable principles and advantages of these filters and/or multiplexers can be implemented together with each other. Moreover, the anti-series bulk acoustic bulk acoustic wave resonators disclosed herein can be included in filter that also includes one or more inductors and one or more capacitors.

Figure 6A:
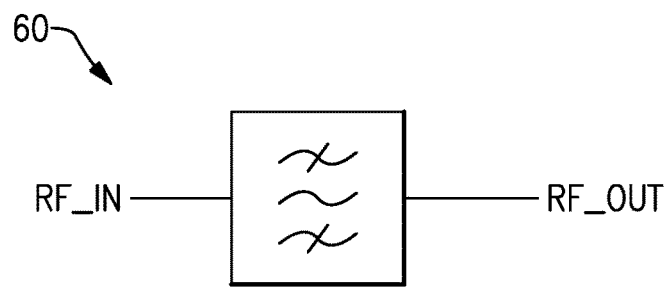
FIG. 6A is a schematic diagram of an acoustic wave filter.

FIG. 6A is schematic diagram of an acoustic wave filter 60. The acoustic wave filter 60 is a band pass filter. The acoustic wave filter 60 is arranged to filter a radio frequency. The acoustic wave filter 60 includes a plurality of bulk acoustic wave resonators coupled between a first input/output port RF_IN and a second input/output port RF_OUT. The acoustic wave filter 60 includes two BAW resonators electrically connected in anti-series with each other by a conductor and an air gap under the conductor according to an embodiment.

Figure 6B:
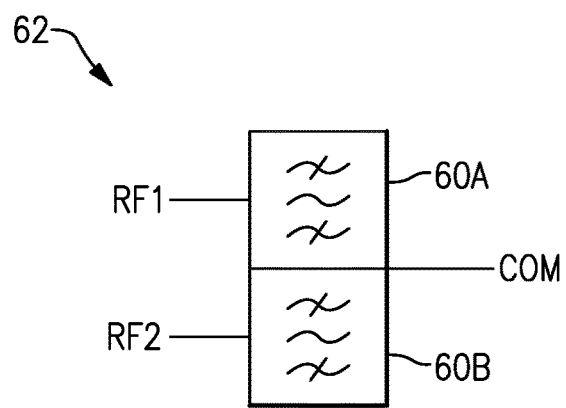
FIG. 6B is a schematic diagram of a duplexer that includes two acoustic wave filters coupled together at a common node according to an embodiment.

FIG. 6B is a schematic diagram of a duplexer 62 that includes an acoustic wave filter according to an embodiment. The duplexer 62 includes a first filter 60A and a second filter 60B coupled to together at a common node COM. One of the filters of the duplexer 62 can be a transmit filter and the other of the filters of the duplexer 62 can be a receive filter. In some other instances, such as in a diversity receive application, the duplexer 62 can include two receive filters. Alternatively, the duplexer 62 can include two transmit filters. The common node COM can be an antenna node.

The first filter 60A is an acoustic wave filter arranged to filter a radio frequency signal. The first filter 60A includes bulk acoustic wave resonators coupled between a first radio frequency node RF1 and the common node COM. The first radio frequency node RF1 can be a transmit node or a receive node. The first filter 60A two BAW resonators electrically connected in anti-series with each other by a conductor and an air gap under the conductor in accordance with any suitable principles and advantages disclosed herein.

The second filter 60B can be any suitable filter arranged to filter a second radio frequency signal. The second filter 60B can be, for example, an acoustic wave filter, an acoustic wave filter that includes two BAW resonators electrically connected in anti-series with each other by a conductor and an air gap under the conductor, an LC filter, a hybrid acoustic wave LC filter, or the like. The second filter 60B is coupled between a second radio frequency node RF2 and the common node. The second radio frequency node RF2 can be a transmit node or a receive node Although example embodiments may be discussed with filters or duplexers for illustrative purposes, any suitable principles and advantages disclosed herein can be implement in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of BAW resonators electrically connected in anti-series with each other by a conductor and an air gap under the conductor.

Figure 6C:
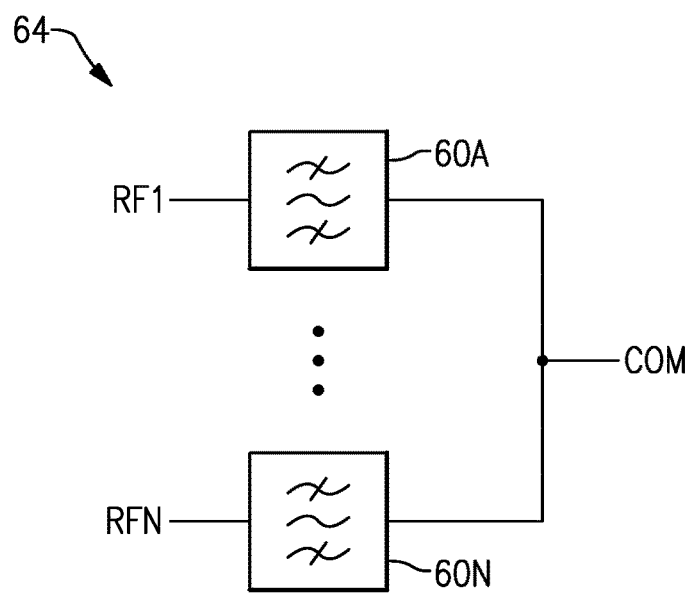
FIG. 6C is a schematic diagram of a multiplexer with hard multiplexing according to an embodiment.

FIG. 6C is a schematic diagram of a multiplexer 64 that includes an acoustic wave filter according to an embodiment. The multiplexer 64 includes a plurality of filters 60A to 60N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 60A to 60N each have a fixed electrical connection to the common node COM. This can be referred to as hard multiplexing or fixed multiplexing. Filters have fixed electrical connections to the common node in hard multiplexing applications. Each of the filters 60A to 60N has a respective input/output node RF1 to RFN.

The first filter 60A is an acoustic wave filter arranged to filter a radio frequency signal. The first filter 60A can include one or more acoustic wave devices coupled between a first radio frequency node RF1 and the common node COM. The first radio frequency node RF1 can be a transmit node or a receive node. The first filter 60A includes two BAW resonators electrically connected in anti-series with each other by a conductor and an air gap under the conductor in accordance with any suitable principles and advantages disclosed herein. The other filter(s) of the multiplexer 64 can include one or more acoustic wave filters, one or more acoustic wave filters that include two BAW resonators electrically connected in anti-series with each other by a conductor and an air gap under the conductor, one or more LC filters, one or more hybrid acoustic wave LC filters, or any suitable combination thereof.

Figure 6D:
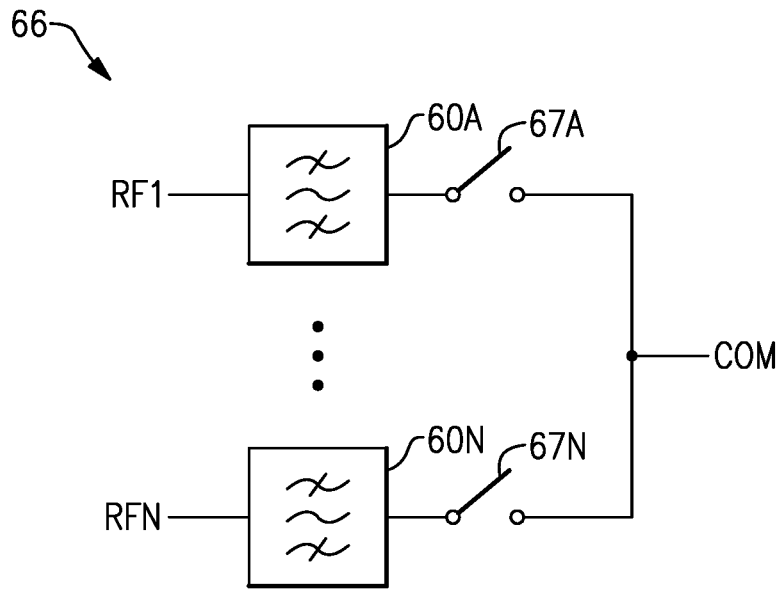
FIG. 6D is a schematic diagram of a multiplexer with switched multiplexing according to an embodiment.

FIG. 6D is a schematic diagram of a multiplexer 66 that includes an acoustic wave filter according to an embodiment. The multiplexer 66 is like the multiplexer 64 of FIG. 6C, except that the multiplexer 66 implements switched multiplexing. In switched multiplexing, a filter is coupled to a common node via a switch. In the multiplexer 66, the switch 67A to 67N can selectively electrically connect respective filters 60A to 60N to the common node COM. For example, the switch 67A can selectively electrically connect the first filter 60A the common node COM via the switch 67A. Any suitable number of the switches 67A to 67N can electrically a respective filters 60A to 60N to the common node COM in a given state. Similarly, any suitable number of the switches 67A to 67N can electrically isolate a respective filter 60A to 60N to the common node COM in a given state. The functionality of the switches 67A to 67N can support various carrier aggregations.

Figure 6E:
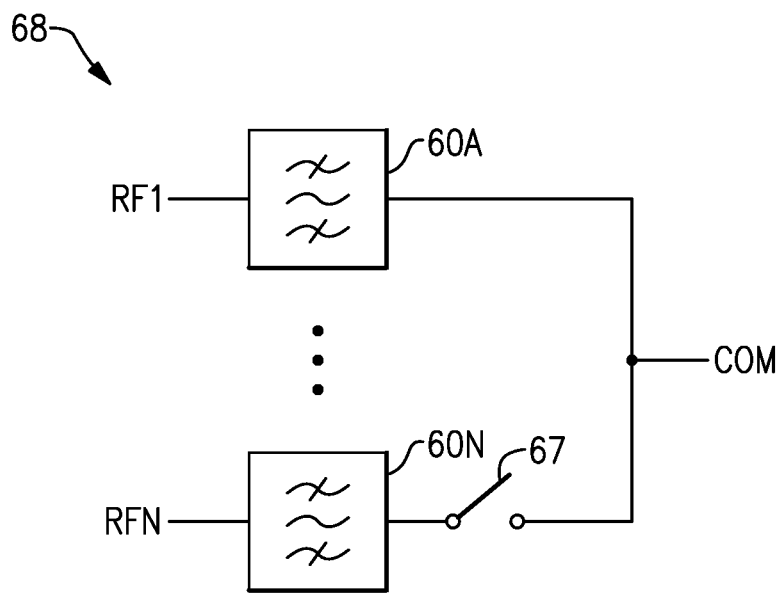
FIG. 6E is a schematic diagram of a multiplexer with a combination of hard multiplexing and switched multiplexing according to an embodiment.

FIG. 6E is a schematic diagram of a multiplexer 68 that includes an acoustic wave filter according to an embodiment. The multiplexer 68 illustrates that a multiplexer can include any suitable combination of hard multiplexed and switched multiplexed filters. Two BAW resonators electrically connected in anti-series with each other by a conductor and an air gap under the conductor can be included in a filter that is hard multiplexed to the common node of a multiplexer. Alternatively or additionally, two BAW resonators electrically connected in anti-series with each other by a conductor and an air gap under the conductor can be included in a filter that is switch multiplexed to the common node of a multiplexer Anti-series BAW resonators can suppress and/or cancel H2 effectively. At an antenna port of a BAW filter, H2 can be mainly composed of H2 generated from a final stage of the BAW filter. H2 can accumulate and leak to an antenna node in cases where BAW resonators do not provide enough rejection at a second harmonic frequency. The impact of H2 from early stages of a BAW filter can be less than the H2 impact from a later stage. This can be due to H2 generated by an early stage being at least partially rejected by one or more later stages of the BAW filter. The H2 contributed by series BAW resonators can dominate the H2 in the second half of the pass band of a band pass filter. The H2 contributed by shunt BAW resonators can dominate the H2 in the first half of the pass band of the band pass filter. Parasitic capacitance can have significant impact on H2 cancellation and/or suppression.

FIGS. 7A to 16 illustrate various views of anti-series BAW resonators that can have relatively low parasitic capacitance associated with the connection between the anti-series BAW resonators. An air gap, such as an air bridge and/or an air cavity, can be included below a conductor electrically connecting a first BAW resonator in anti-series with a second BAW resonator. The air gap can reduce parasitic capacitance and thereby improve H2 suppression.

The anti-series BAW resonators disclosed herein can be implemented in any of the filters and/or multiplexers disclosed herein. For example, any of the anti-series BAW resonators of FIGS. 7A to 16 can correspond to the anti-series BAW resonators TS6 and TS7 of the transmit filter 10 of FIG. 1. As another example, any of the anti-series BAW resonators of FIGS. 7A to 16 can correspond to the anti-series BAW resonators TS2 and TS2' of the transmit filter 40 of FIG. 4. As one more example, any of the anti-series BAW resonators of FIGS. 7A to 16 can correspond to the anti-series BAW resonators RS5 and RS6 of the receive filter 50 of FIG. 5.

Filters including anti-series BAW resonators disclosed herein can filter radio frequency signals at frequencies up about 6 GHz, up to about 7 GHz, and/or up to about 10 GHz. Mid band filters, high band filters, and/or ultra-high band filters can include anti-series BAW resonators disclosed herein. Any suitable combination of features of the anti-series BAW resonators disclosed herein can be implemented together with each other. Example anti-series BAW resonators will now be discussed with reference to FIGS. 7A to 16.

BAW resonators of FIGS. 7A to 16 include frame structures. A frame structure can include a raised frame structure, a recessed frame structure, or a raised frame structure and a recessed frame structure. Certain raised frame structures disclosed herein are multi-layer raised frame structures that include two or more layers. Raised frame structures can provide mass loading and/or provide transverse spurious mode suppression. A raised frame structure can block lateral energy leakage from the active domain of a bulk acoustic wave resonator. This can increase the quality factor (Q) of the bulk acoustic wave resonator. The raised frame structure 5 can be annular in plan view.

The cross sectional views of FIGS. 7A to 16 illustrate acoustic wave components. These cross sectional views each illustrate part of a chip that includes BAW resonators. Although the embodiments of FIGS. 7A to 16A relate to BAW resonators, any suitable principles and advantages of these embodiments can be applied to any other suitable acoustic wave devices, such as Lamb wave resonators.

FIG. 7A is a cross sectional view of an acoustic wave component 70 that includes anti-series BAW resonators with an air bridge below a conductor electrically connecting the anti-series BAW resonators according to an embodiment. These anti-series BAW resonators can be included in an acoustic wave filter arranged to filter a radio frequency signal. As illustrated, the acoustic wave component 70 includes a first BAW resonator 72 and a second BAW resonator 74 on a common substrate 75. A conductor 76 electrically connects the first BAW resonator 72 in anti-series with the second BAW resonator 74.

In the acoustic wave component 70, there is a relatively low parasitic capacitance associated with the conductor 76. An air bridge 77 between the conductor 76 and the substrate 75 can reduce parasitic capacitance associated with the conductor 76. The air bridges 78 and 79 positioned between the conductor 76 and respective piezoelectric layers of the BAW resonators 72 and 74 can also reduce parasitic capacitance associated with the conductor 76. The air bridges 77, 78, and 79 can have depths in a range from about 0.1 micrometer to 0.2 micrometer. The air bridges 77, 78, and 79 provide low-k dielectrics between the conductor 76 and other layers. The air bridges 77, 78, and 79 can provide low-k dielectrics between the conductor 76 and other layers. With the low-k dielectrics, parasitic capacitance associated with the conductor 76 can be relatively small. Accordingly, H2 can be reduced, for example, as indicated by FIG. 3.

A low-k dielectric can have a dielectric constant that is less than the dielectric constant of silicon dioxide. The dielectric constant of a low-k dielectric can be less than 3.9. For example, the dielectric constant of air can be about 1. Any suitable low-k dielectric can be used in place of or in addition to air in accordance with any suitable principles and advantages disclosed herein. For example, any of the air gaps disclosed herein can be filled with any suitable low-k dielectric material (e.g., polyimide) in place of air.

The substrate 75 can be a carrier wafer. The substrate 75 can be include any suitable material. For example, the substrate 75 can be silicon, aluminum oxide, silicon nitride, a dielectric material, silicon carbine, or spinel.

The conductor 76 can include any suitable conductive material, such as molybdenum (Mo), tungsten (W), ruthenium (Ru), iridium (Ir), platinum (Pt), copper (Cu), gold (Au), or any suitable combination thereof. A second metal layer contact 80 can provide an electrical connection to the conductor 76.

The first BAW resonator 72 is an FBAR. As illustrated, the first BAW resonator 72 includes a piezoelectric layer 82, a first electrode 83, and a second electrode 84. The piezoelectric layer 82 is disposed between the first electrode 83 and the second electrode 84. The piezoelectric layer 82 can be an aluminum nitride (AlN) layer or any other suitable piezoelectric layer, such as a zinc oxide (ZnO) layer, an aluminum chromium nitride (AlCrN) layer, or an aluminum scandium nitride layer (AlScN). In certain instances, the piezoelectric layer 82 can be an aluminum nitride layer doped with scandium (Sc). An active region or active domain of the first BAW resonator 72 can be defined by the portion of the piezoelectric layer 82 that overlaps with both the first electrode 83 and the second electrode 84. The first electrode 83 can have a relatively high acoustic impedance. For example, the first electrode 83 can include molybdenum, tungsten, ruthenium, iridium, platinum, copper, gold, or any suitable combination thereof. Similarly, the second electrode 84 can have a relatively high acoustic impedance. The second electrode 84 can be formed of the same material as the first electrode 83 in certain instances.

An air cavity 85 is included between the substrate 75 and the first electrode 83. The air cavity 85 can be etched into the substrate 75.

A first passivation layer 86 can be included between the first electrode 83 and the substrate 75. The first passivation layer 86 can be a silicon dioxide layer. An adhesion layer 90 can be included between the first passivation layer 86 and the first electrode 83. The adhesion layer 90 can be a titanium layer. A second passivation layer 87 can be included over the second electrode 84. The second passivation layer 87 can be a silicon dioxide layer. The second passivation layer 87 can be patterned to contribute to transverse mode suppression. A second metal layer contact 88 can provide an electrical connection to the first electrode 83 of the first BAW resonator 72.

The illustrated first BAW resonator 72 also includes a raised frame structure 89 for transverse mode suppression. The raised frame structure 89 is positioned in a raised frame zone around a perimeter of the active region of the first BAW resonator 72. The raised frame structure 89 can surround a middle area of the active region of the BAW resonator 72 in plan view. The raised frame structure 89 extends further from the piezoelectric layer 82 than the portion of the electrode 84 over the middle of the active region of the BAW resonator 72. The first BAW resonator 72 also includes a recessed frame structure 73.

The second BAW resonator 74 is an FBAR. The second BAW resonator 74 can be similar to the first BAW resonator 72. As illustrated, the second BAW resonator 74 includes a piezoelectric layer 92 positioned between a first electrode 93 and a second electrode 94. An air cavity 95 is included between the substrate 75 the first electrode 93. A first passivation layer 96 can be included between the first electrode 93 and the substrate 75. An adhesion layer 91 can be included between the first passivation layer 96 and the first electrode 93. A second passivation layer 97 can be included over the second electrode 94. A second metal layer contact 98 can provide an electrical connection to the first electrode 93 of the second BAW resonator 74. The first BAW resonator 74 can also include a raised frame structure 99 for transverse mode suppression.

FIG. 7B is a plan view of the anti-series BAW resonators 72 and 74 of the acoustic wave component 70 of FIG. 7A.

Certain BAW resonators disclosed herein include multi-layer raised frame structures. The multi-layer raised frame structures can be dual layer raised frame structures as illustrated. The multi-layer raised frame structures can be positioned in a raised frame zone around a perimeter of the active region of a BAW resonator. Multi-layer raised frame structures can surround a middle area of the active region of a BAW resonator. A multi-layer raised frame structure can include a layer of low acoustic impedance material positioned between a piezoelectric layer and an electrode of a BAW resonator, in which the low acoustic impedance material has a lower acoustic impedance than the electrode. The low acoustic impedance material can be silicon dioxide ($SiO_2$). An acoustic wave component with BAW resonators each having a multi-layer raised frame structure will be discussed with reference to FIG. 7C. Other acoustic wave components with multi-layer raised frame structures are disclosed in FIGS. 8B, 10C, 11B, 12B, 13B, and 14B.

FIG. 7C is a cross sectional view of an acoustic wave component 70' that includes anti-series BAW resonators with an air bridge below a conductor electrically connecting the anti-series BAW resonators according to an embodiment. These anti-series BAW resonators can be included in an acoustic wave filter arranged to filter a radio frequency signal. As illustrated, the acoustic wave component 70' includes a first BAW resonator 72' and a second BAW resonator 74' with a conductor 76 electrically connecting the first BAW resonator 72' in anti-series with the second BAW resonator 74'. The air bridge 77 is an air gap between the conductor 76 and the substrate 75.

The first BAW resonator 72' includes a multi-layer raised frame structure 115. The multi-layer raised frame structure 115 includes a first layer and a second layer. The multi-layer raised frame structure 115 can be referred to as a dual raised frame structure. The first layer can include metal extending farther from the substrate 75 than a portion of second electrode 84 in the middle of the active region of the first BAW resonator 72'. The first layer can include one or more of ruthenium, molybdenum tungsten, iridium, platinum, chromium, silicon dioxide, silicon nitride, silicon oxynitride, aluminum oxide, or silicon carbide. The second layer of the multi-layer raised frame 115 is a low acoustic impedance layer 117 positioned between an electrode of the first BAW resonator 72' (i.e., the second electrode 84 as illustrated) and the piezoelectric layer 105. The low acoustic impedance layer 117 can be in contact with the piezoelectric layer 105 and the second electrode 84 on opposing sides of the active region of the first BAW resonator 72' as illustrated. The low acoustic impedance layer 117 can extend over the air bridge 78 as also illustrated. The low acoustic impedance layer 117 can have a lower acoustic impedance than the second electrode 84. The low acoustic impedance layer 117 can have a lower acoustic impedance than the piezoelectric layer 105. The low acoustic impedance layer 117 can be a silicon dioxide layer, for example. Because silicon dioxide is already used in a variety of bulk acoustic wave devices, a silicon dioxide low acoustic impedance layer 117 can be relatively easy to manufacture. The low acoustic impedance layer 117 can be a silicon nitride (SiN) layer, a silicon carbide (SiC) layer, or any other suitable low acoustic impedance layer. The dual raised frame structure 115 can improve Q significantly due to efficient reflection of lateral energy.

The low acoustic impedance layer 117 can reduce an effective electromechanical coupling coefficient ($k^2$) of the raised frame domain of the bulk acoustic wave resonator 72' relative to a similar device without the low acoustic impedance layer 117. This can reduce excitation strength of a raised frame spurious mode. Moreover, the low acoustic impedance layer 117 can contribute to move the frequency of the raised frame mode relatively far away from the main resonant frequency of the first BAW resonator 72', which can result in no significant effect on a Gamma loss.

An outer portion of the illustrated multi-layer raised frame structure 115 includes L-wing structure. The L-wing structure can provide mass loading. The L-wing structure can be spaced apart from the piezoelectric layer 105 by air. In the cross sectional shown in FIG. 7C, the L-wing structure can be symmetrical with the air bridge 78 about a central axis of the first BAW resonator 72'.

The first BAW resonator 72' also includes a recessed frame structure 73.

The second BAW resonator 74' can be similar to the first BAW resonator 72'. For example, the second BAW resonator 74' can include a multi-layer raised frame structure 116 that is similar to the multi-layer raised frame structure 115. The multi-layer raised frame structure 116 includes a low acoustic impedance layer 118 that can be implemented in accordance with any suitable principles and advantages of the low acoustic impedance layer 117.

As shown in FIG. 7C, a passivation layer 106 can be over the substrate 75 on a side of the air cavities 85 and 95 opposite to the first electrodes 83 and 93, respectively. The passivation layer 106 can be a silicon dioxide layer.

The acoustic wave component 70' includes a substrate 75 with a trap rich layer 81. The trap rich layer 81 can have crystal defects. The substrate 75 illustrated in FIG. 7C can be a trap rich silicon substrate. BAW components disclosed herein can include silicon-on-insulator substrates, such as trap rich silicon-on-insulator substrates.

FIG. 7D is a plan view of the anti-series BAW resonators 72' and 74' of the acoustic wave component 70' of FIG. 7C.

Figure 8A:
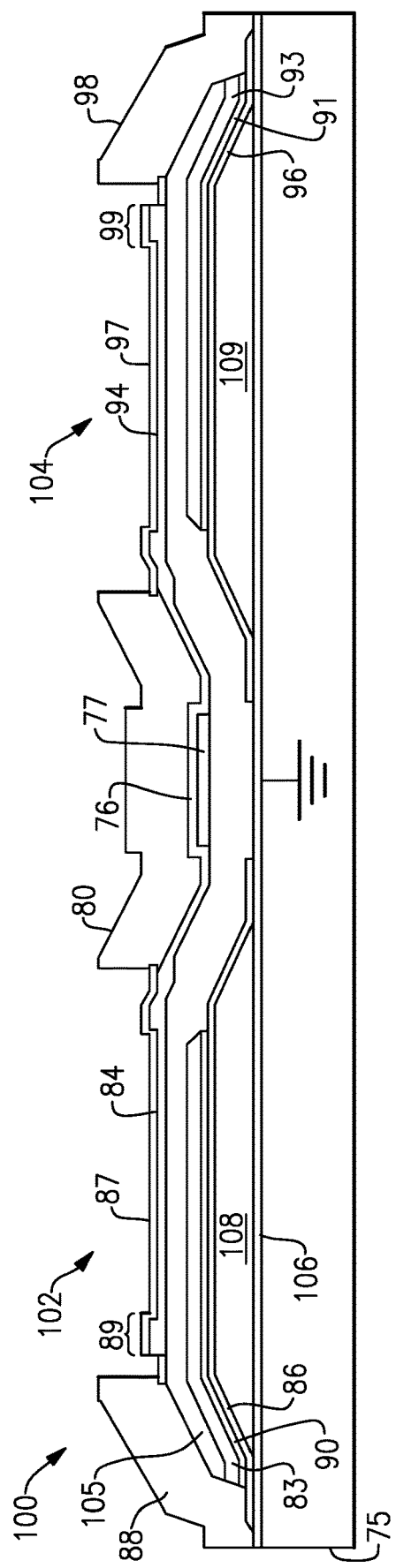
FIG. 8A is a cross sectional view of an acoustic wave component that includes anti-series BAW resonators with an air bridge below a conductor electrically connecting the anti-series BAW resonators according to an embodiment.

FIG. 8A is a cross sectional view of an acoustic wave component 100 that includes anti-series BAW resonators with an air bridge below a conductor electrically connecting the anti-series BAW resonators according to an embodiment. These anti-series BAW resonators can be included in an acoustic wave filter arranged to filter a radio frequency signal. As illustrated, the acoustic wave component 100 includes a first BAW resonator 102 and a second BAW resonator 104 on a common substrate 75. A conductor 76 electrically connects the first BAW resonator 102 in anti-series with the second BAW resonator 104. In the acoustic wave component 100, the air cavities 108 and 108 are above the substrate 75. The BAW resonators 102 and 104 have different geometries than the BAW resonators 72 and 74, respectively. The BAW resonators 102 and 104 share a common piezoelectric layer 105. The piezoelectric layer 105 can include, for example, any suitable piezoelectric material discussed with reference to the piezoelectric layer 82 of FIG. 7A. There is a single air bridge 77 between the conductor 76 and the substrate 75 in the acoustic wave component 100. The air bridge 77 illustrated in FIG. 8A is between the conductor 76 and the common piezoelectric layer 105. A passivation layer 106 can be over the substrate 75 on a side of the air cavities 108 and 109 opposite to the first electrodes 83 and 93, respectively.

Figure 8B:
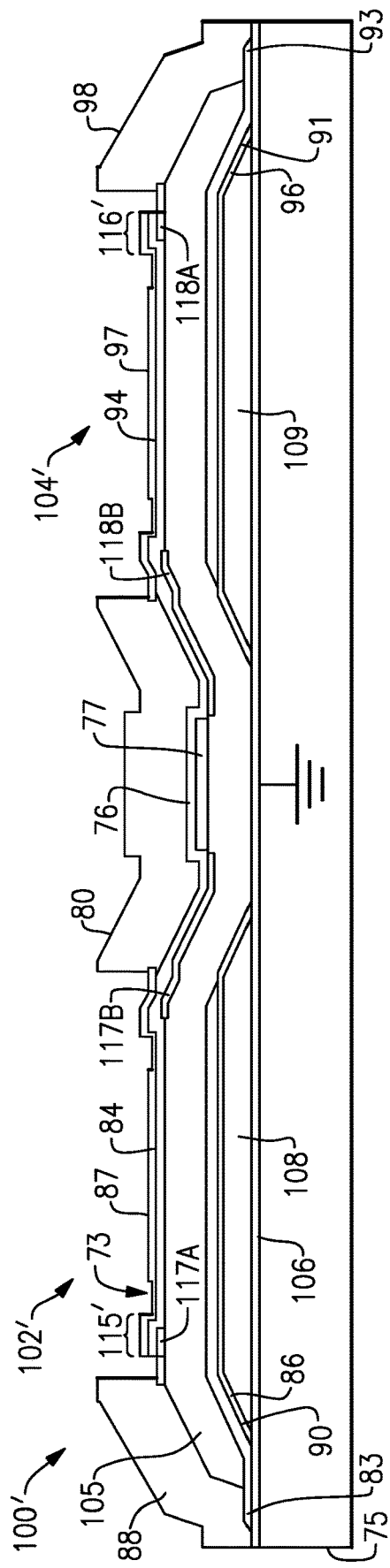
FIG. 8B is a cross sectional view of an acoustic wave component that includes anti-series BAW resonators with an air bridge below a conductor electrically connecting the anti-series BAW resonators according to another embodiment.

FIG. 8B is a cross sectional view of an acoustic wave component 100' that includes anti-series BAW resonators with an air bridge below a conductor electrically connecting the anti-series BAW resonators according to an embodiment. These anti-series BAW resonators can be included in an acoustic wave filter arranged to filter a radio frequency signal. The illustrated acoustic wave component 100' includes a first BAW resonator 102' and a second BAW resonator 104' electrically connected in anti-series with each other by the conductor 76. Like the acoustic wave component 100, the acoustic wave component 100' includes the air bridge 77 under the conductor 76. The air bridge 77 is an air gap positioned between the conductor 76 and the substrate 75. The acoustic wave component 100' is similar to the acoustic wave component 100 of FIG. 8A, except that the acoustic wave component 100' includes BAW resonators 102' and 104' with different frame structures than the BAW resonators 102 and 104 of the acoustic wave component 100.

The first BAW resonator 102' includes a multi-layer raised frame structure 115' and a recessed frame structure 73. The multi-layer raised frame structure 115' includes two layers. Accordingly, the multi-layer raised frame structure 115' can be referred to as a dual raised frame structure. A first layer of the multi-layer raised frame structure 115' can include metal extending farther from the substrate 75 than a portion of second electrode 84 in the middle of the active region of the first BAW resonator 102'. The first layer can include one or more of ruthenium, molybdenum tungsten, iridium, platinum, chromium, silicon dioxide, silicon nitride, silicon oxynitride, aluminum oxide, or silicon carbide. The second layer of the of the multi-layer raised frame 115' is a low acoustic impedance layer positioned between an electrode of the first BAW resonator 102' (i.e., the second electrode 84 as illustrated) and the piezoelectric layer 105. The low impedance layer can be in contact with both the electrode and the piezoelectric layer 105. The low impedance layer can include a first portion 117A and a second portion 117B that are asymmetric on opposing sides of the first BAW resonator 102'. The low acoustic impedance layer can be a silicon dioxide layer. The low impedance layer can be implemented in accordance with any suitable principles and advantages of the low impedance layers 117 disclosed herein. The dual raised frame structure 115' can function similarly to the dual raised frame layer 115 of FIG. 7C.

The second BAW resonator 104' can be similar to the first BAW resonator 102'. For example, the second BAW resonator 104' can include a multi-layer raised frame structure 116' that is similar to the multi-layer raised frame structure 115'. The multi-layer raised frame structure 116' includes a low acoustic impedance layer with a first portion 118A and a second portion 118B that can be implemented in accordance with any suitable principles and advantages of the first portion 117A and the second portion 117B, respectively, of the low acoustic impedance layer of the multi-layer raised frame structure 115'.

Figure 9:
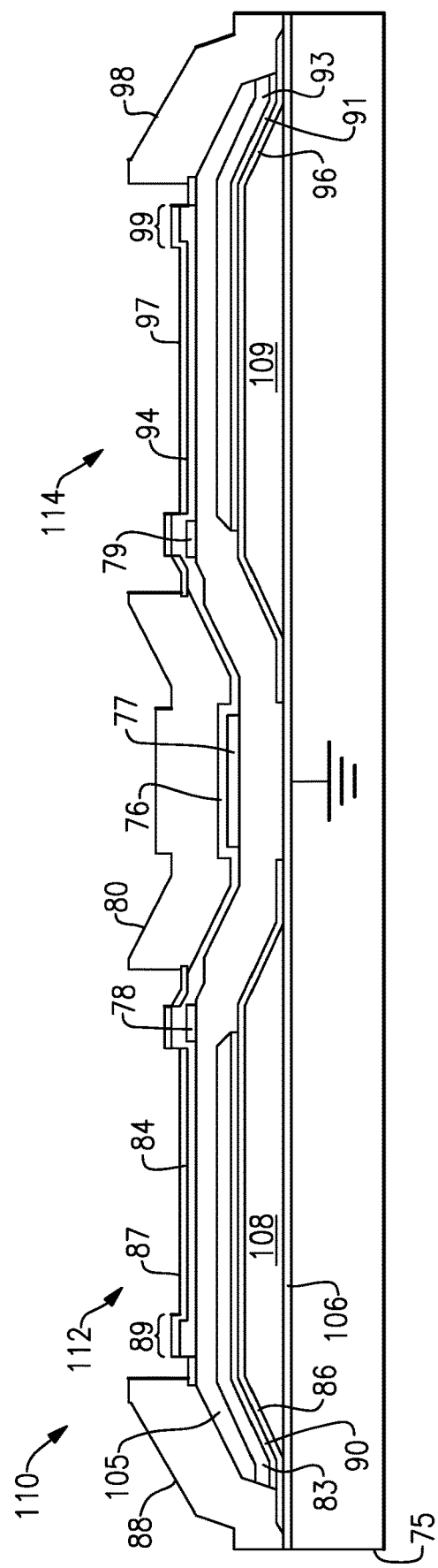
FIG. 9 is a cross sectional view of an acoustic wave component that includes anti-series BAW resonators with an air bridge below a conductor electrically connecting the anti-series BAW resonators according to another embodiment.

FIG. 9 is a cross sectional view of an acoustic wave component 100 that includes anti-series BAW resonators with an air bridge below a conductor electrically connecting the anti-series BAW resonators according to another embodiment. These anti-series BAW resonators can be included in an acoustic wave filter arranged to filter a radio frequency signal. As illustrated, the acoustic wave component 110 includes a first BAW resonator 112 and a second BAW resonator 114 on a common substrate 75. The conductor 76 electrically connects the first BAW resonator 122 in anti-series with the second BAW resonator 114. The acoustic wave component 110 is like the acoustic wave component 100 of FIG. 8A except that additional air bridges 78 and 79 are included in the acoustic wave component 110.

FIG. 10A is a cross sectional view of an acoustic wave component 120 that includes anti-series BAW resonators with an air cavity below a conductor electrically connecting the anti-series BAW resonators according to an embodiment. These anti-series BAW resonators can be included in an acoustic wave filter arranged to filter a radio frequency signal. As illustrated, the acoustic wave component 120 includes a first BAW resonator 122 and a second BAW resonator 124 on a common substrate 75. The conductor 76 electrically connects the first BAW resonator 122 in anti-series with the second BAW resonator 124. The acoustic wave component 120 is like the acoustic wave component 70 of FIG. 7A except that an air cavity 125 is implemented in the acoustic wave component 120 place of the air bridge 77 of the acoustic wave component 70. The air cavity 125 is an air gap between the conductor 76 and the substrate 75. The acoustic wave component 120 includes the air cavity 125 and air bridges 78 and 79 between the conductor 76 and the substrate 75. The air cavity 125 can be etched into the substrate 75. The air cavity 125 can have a depth of about 1 micrometer. The air cavity 125 is deeper than the air bridge 77 of the acoustic wave component 70. Accordingly, the air cavity 125 can reduce parasitic capacitance more than the air bridge 77 in certain instances.

FIG. 10B is a plan view of the anti-series BAW resonators 122 and 124 of the acoustic wave component 120 of FIG. 10A.

FIG. 10C is a cross sectional view of an acoustic wave component 120' that includes anti-series BAW resonators with an air cavity below a conductor electrically connecting the anti-series BAW resonators according to an embodiment. These anti-series BAW resonators can be included in an acoustic wave filter arranged to filter a radio frequency signal. As illustrated, the acoustic wave component 120' includes a first BAW resonator 122' and a second BAW resonator 124' on a common substrate 75. The conductor 76 electrically connects the first BAW resonator 122 in anti-series with the second BAW resonator 124. The acoustic wave component 120' is like the acoustic wave component 70' of FIG. 7C except that an air cavity 125 is implemented in the acoustic wave component 120 in place of the air bridge 77 of the acoustic wave component 70. The air cavity 125 is an air gap between the conductor 76 and the substrate 75. The BAW resonators 122' and 124' each include multi-layer raised frame structures like the respective acoustic wave resonators 72' and 74' of FIG. 7C.

FIG. 10D is a plan view of the anti-series BAW resonators 122' and 124' of the acoustic wave component 120' of FIG. 10C.

Figure 11A:
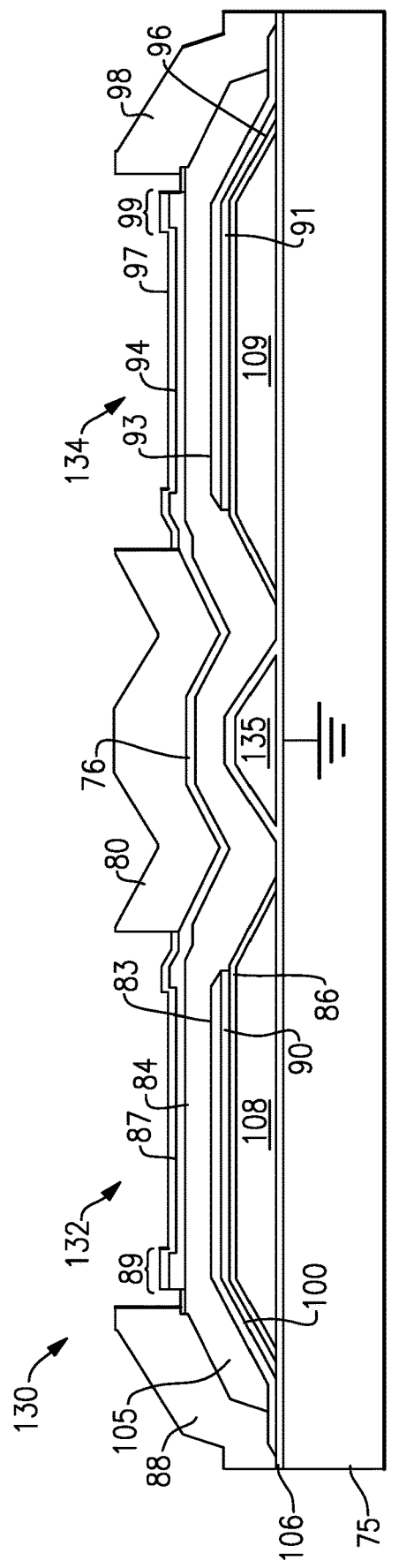
FIG. 11A is a cross sectional view of an acoustic wave component that includes anti-series BAW resonators with an air cavity below a conductor electrically connecting the anti-series BAW resonators according to an embodiment.

FIG. 11A is a cross sectional view of an acoustic wave component 130 that includes anti-series BAW resonators with an air cavity below a conductor electrically connecting the anti-series BAW resonators according to an embodiment. These anti-series BAW resonators can be included in an acoustic wave filter arranged to filter a radio frequency signal. The illustrated acoustic wave component 130 includes a first BAW resonator 132 and a second BAW resonator 134 on a common substrate 75. The conductor 76 electrically connects the first BAW resonator 132 in anti-series with the second BAW resonator 134. The air cavity 135 is an air gap under the conductor 76. The acoustic wave component 130 is like the acoustic wave component 100 of FIG. 8A except that an air cavity 135 is implemented in the acoustic wave component 130 place of the air bridge 77 of the acoustic wave component 100. The geometry of layers above the air cavity 135 is different in the acoustic wave component 130 compared to the acoustic wave component 100 of FIG. 8A.

Figure 11B:
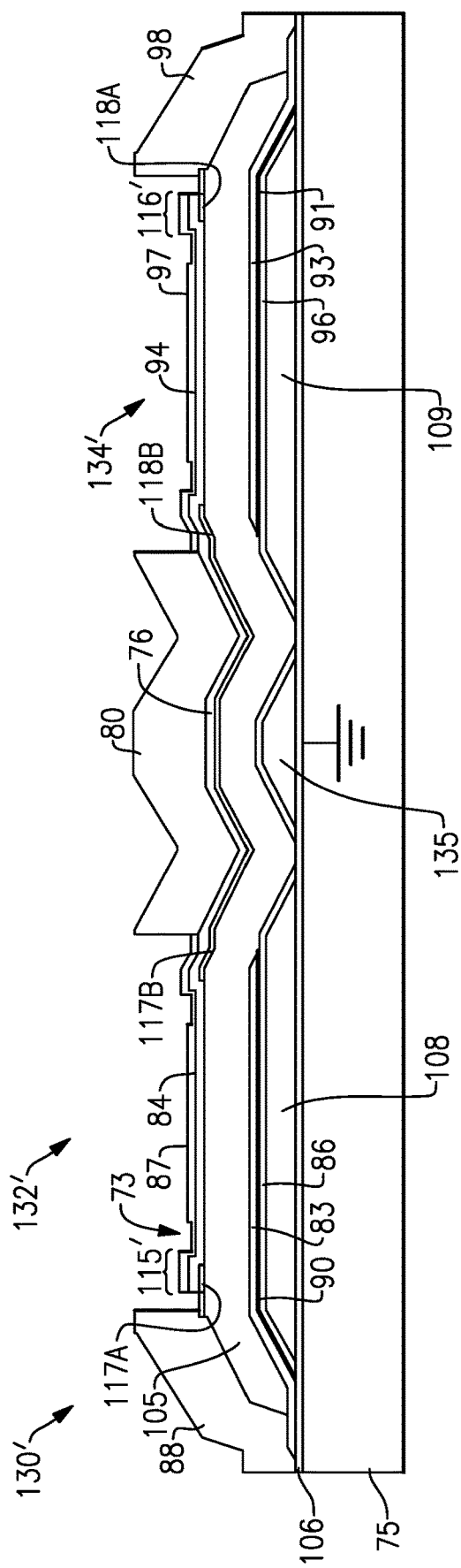
FIG. 11B is a cross sectional view of an acoustic wave component that includes anti-series BAW resonators with an air cavity below a conductor electrically connecting the anti-series BAW resonators according to another embodiment.

FIG. 11B is a cross sectional view of an acoustic wave component 130' that includes anti-series BAW resonators with an air cavity below a conductor electrically connecting the anti-series BAW resonators according to an embodiment. These anti-series BAW resonators can be included in an acoustic wave filter arranged to filter a radio frequency signal. The illustrated acoustic wave component 130' includes a first BAW resonator 132' and a second BAW resonator 134' electrically connected in anti-series with each other by the conductor 76. The air cavity 135 is an air gap under the conductor 76. The acoustic wave component 130' is like the acoustic wave component 130 of FIG. 11A except that the bulk acoustic wave resonators 132' and 134' include multi-layer raised frame structures 115 and 116, respectively, and recessed frame structures including the recessed frame structure 73 of the bulk acoustic wave resonator 132'. The multi-layer raised frame structures 115 and 116 of FIG. 11B are like the multi-layer raised frame structures 115 and 116 of FIG. 8B. In the acoustic wave component 130' material of the low acoustic impedance layers of the multi-layer raised frame structures 115 and 116 extends between the conductor 76 and the piezoelectric layer 105 as illustrated.

Figure 12A:
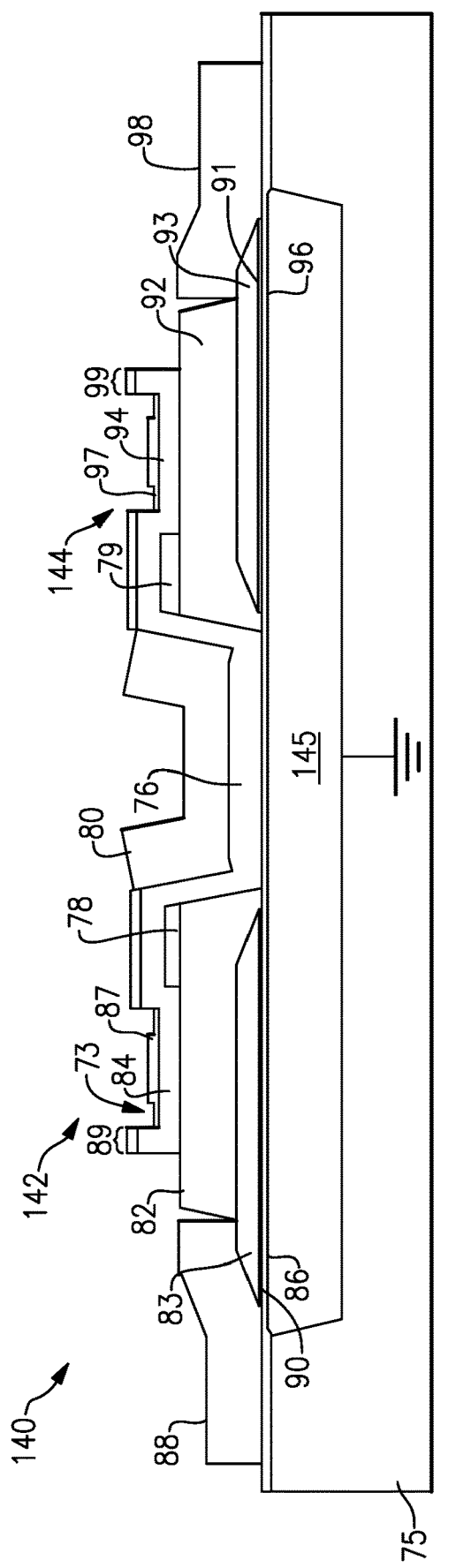
FIG. 12A is a cross sectional view of an acoustic wave component that includes anti-series BAW resonators that share an air cavity that extends below a conductor electrically connecting the anti-series BAW resonators according to an embodiment.

FIG. 12A is a cross sectional view of an acoustic wave component 140 that includes anti-series BAW resonators that share an air cavity that extends below a conductor electrically connecting the anti-series BAW resonators according to an embodiment. These anti-series BAW resonators can be included in an acoustic wave filter arranged to filter a radio frequency signal. The illustrated acoustic wave component 140 includes a first BAW resonator 142 and a second BAW resonator 144 on a common substrate 75. The conductor 76 electrically connects the first BAW resonator 142 in anti-series with the second BAW resonator 144. The acoustic wave component 140 is like the acoustic wave component 120 of FIG. 10A except that a common air cavity 145 is included in the acoustic wave component 140. The air cavity 145 is between the conductor 76 and a surface of the substrate 75. The air cavity is between the first electrodes 83 and 93 of the BAW resonators 142 and 144, respectively, and the surface of the substrate 75. The air cavity 145 extends between the first BAW resonator 142, the conductor 76, and the second BAW resonator 144 and the substrate 75. The air cavity 145 is a single cavity that extends under BAW resonators 142 and 144 and the electrical connection between these BAW resonators.

Figure 12B:
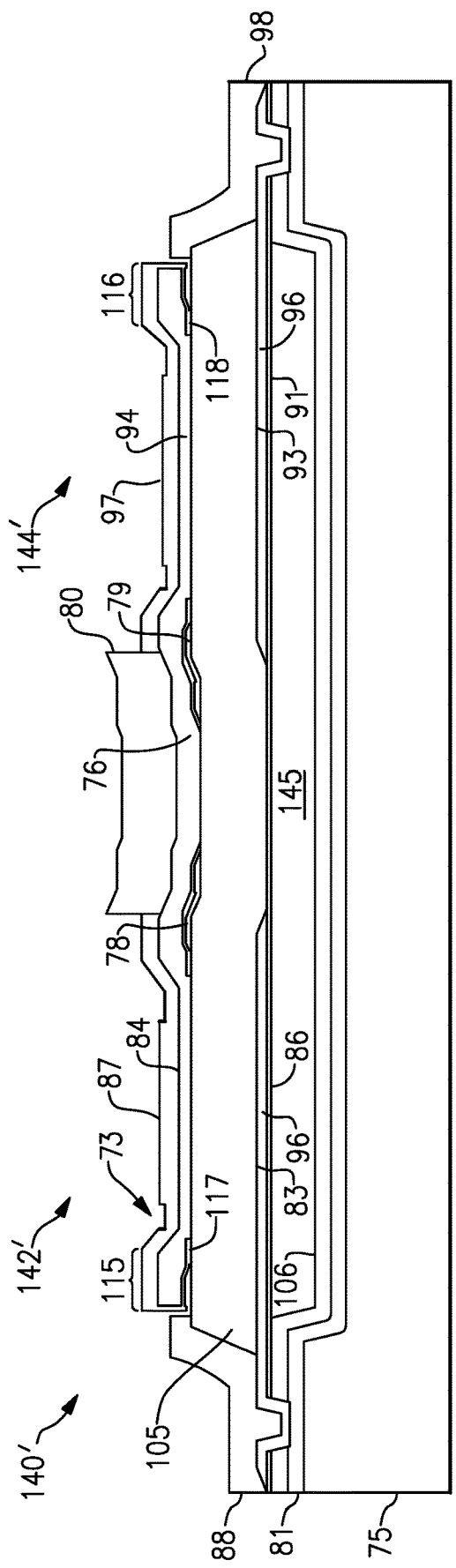
FIG. 12B is a cross sectional view of an acoustic wave component that includes anti-series BAW resonators that share an air cavity that extends below a conductor electrically connecting the anti-series BAW resonators according to another embodiment.

FIG. 12B is a cross sectional view of an acoustic wave component 140' that includes anti-series BAW resonators that share an air cavity according to another embodiment. These anti-series BAW resonators can be included in an acoustic wave filter arranged to filter a radio frequency signal. The illustrated acoustic wave component 140' includes a first BAW resonator 142' and a second BAW resonator 144' electrically connected in anti-series with each other by the conductor 76. The air cavity 145 is an air gap under the conductor 76. The acoustic wave component 140' is like the acoustic wave component 140' of FIG. 10C except that a common air cavity 145 extending between the anti-series BAW resonators 142' and 144' and the conductor 76 is implemented. The air cavity 145 of the acoustic wave component 140' is similar to the air cavity 145 in the acoustic wave component 140. The multi-layer raised frame structures 115 and 116 of FIG. 12B are like the respective multi-layer raised frame structures 115 and 116 of FIGS. 7C and 10C.

Figure 13A:
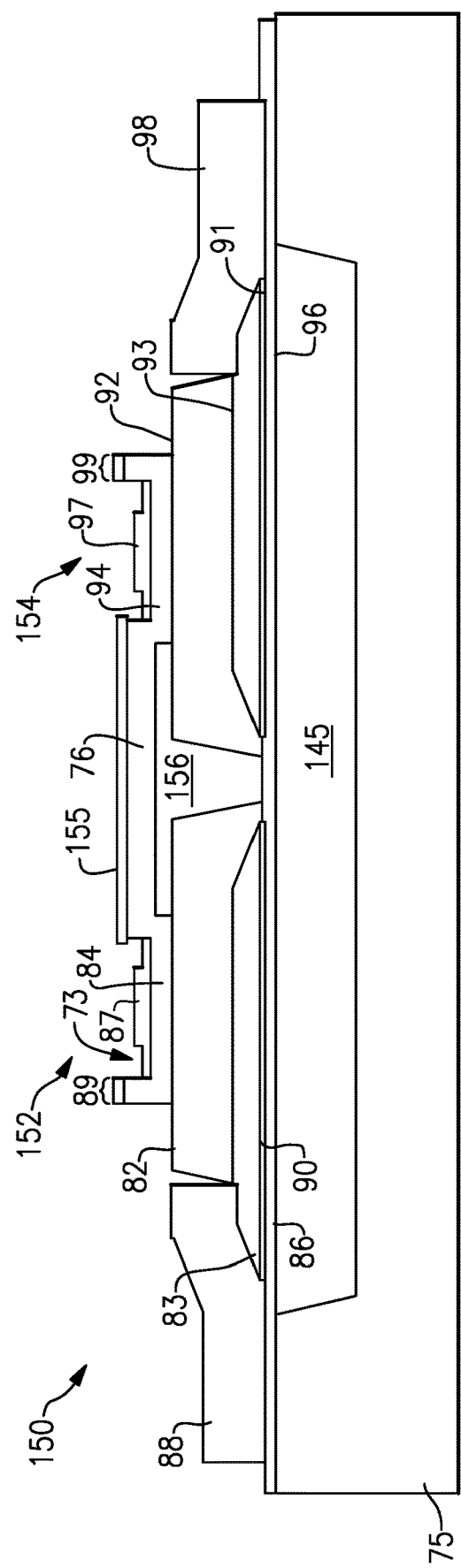
FIG. 13A is a cross sectional view of an acoustic wave component that includes anti-series BAW resonators that share an air cavity according to an embodiment.

FIG. 13A is a cross sectional view of an acoustic wave component 150 that includes anti-series BAW resonators that share an air cavity according to an embodiment. These anti-series BAW resonators can be included in an acoustic wave filter arranged to filter a radio frequency signal. The illustrated acoustic wave component 150 includes a first BAW resonator 152 and a second BAW resonator 154 electrically connected in anti-series with each other by the conductor 76. The acoustic wave component 150 is like the acoustic wave component 140 of FIG. 12A except an air bridge 156 is included in the acoustic wave component 150 and passivation material 155 is included over the conductor 76 in the acoustic wave component 150. The second metal layer contact 80 of the acoustic wave component 140 is omitted in the illustrated acoustic wave component 150. The anti-series BAW resonators 152 and 154 are relatively close to each other in the acoustic wave component 150. This can reduce the length of the conductor 76. A reduced conductor length can contribute to smaller physical area and/or less parasitic capacitance.

Figure 13B:
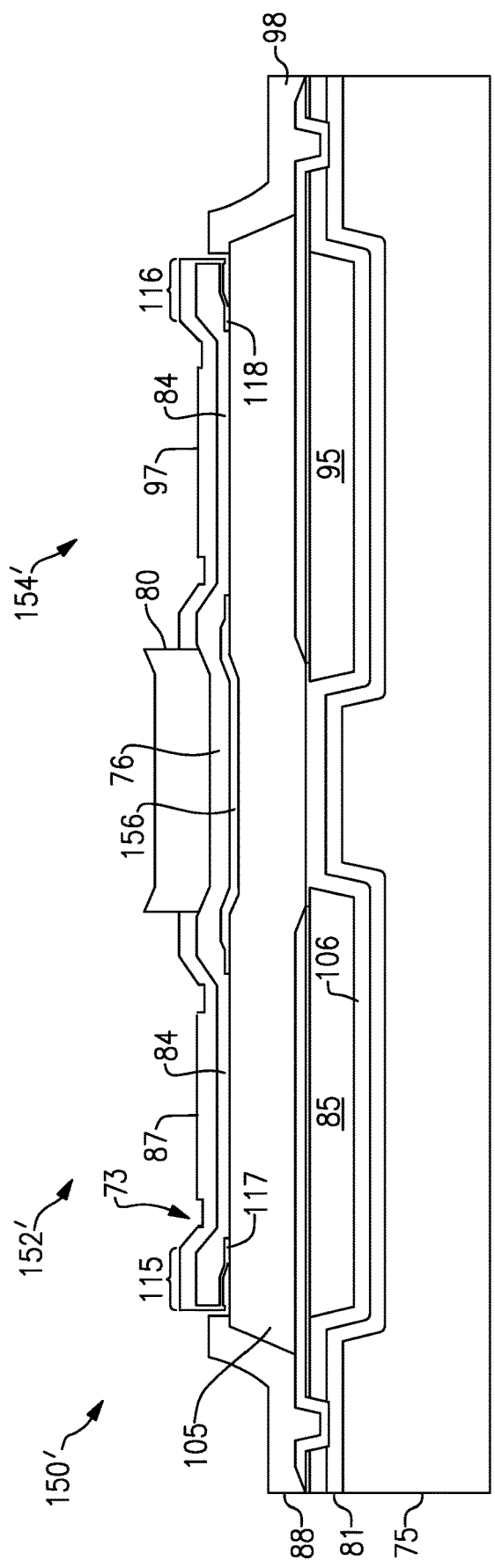
FIG. 13B is a cross sectional view of an acoustic wave component that includes anti-series BAW resonators according to another embodiment.

FIG. 13B is a cross sectional view of an acoustic wave component 150' that includes anti-series BAW resonators according to an embodiment. These anti-series BAW resonators can be included in an acoustic wave filter arranged to filter a radio frequency signal. The illustrated acoustic wave component 150' includes a first BAW resonator 152' and a second BAW resonator 154' electrically connected in anti-series with each other by the conductor 76. Like the acoustic wave component 150, the acoustic wave component 150' includes the air bridge 156 under the conductor 76. The air bridge 156 is an air gap positioned between the conductor 76 and the substrate 75. As illustrated in FIG. 13B, the air bridge 156 is an air gap positioned between the conductor 76 and the piezoelectric layer 105. The illustrated air bridge 156 is a common air bridge than extends under the conductor 76 for a full length between electrodes of the BAW resonators 152' and 154'. The air bridge 156 shown in FIG. 13B has a different geometry than the air bridge 156 shown in FIG. 13A. The BAW resonators 152' and 154' include separate respective cavities 85 and 95 unlike the BAW resonators 152 and 154 of the acoustic wave component 150 of FIG. 13A. The substrate 75 of the acoustic wave component 150' also includes a trap rich layer 81.

The BAW resonator 152' includes a multi-layer raised frame structure 115 and a recessed frame structure 73. The multi-layer raised frame structure 115 of FIG. 13B is like the multi-layer raised frame structure 115 of FIGS. 7C, 10C, 12B. The BAW resonator 154' includes a multi-layer raised frame structure 116. The multi-layer raised frame structure 116 of FIG. 13B is like the multi-layer raised frame structure 116 of FIGS. 7C, 10C, 12B.

Figure 14A:
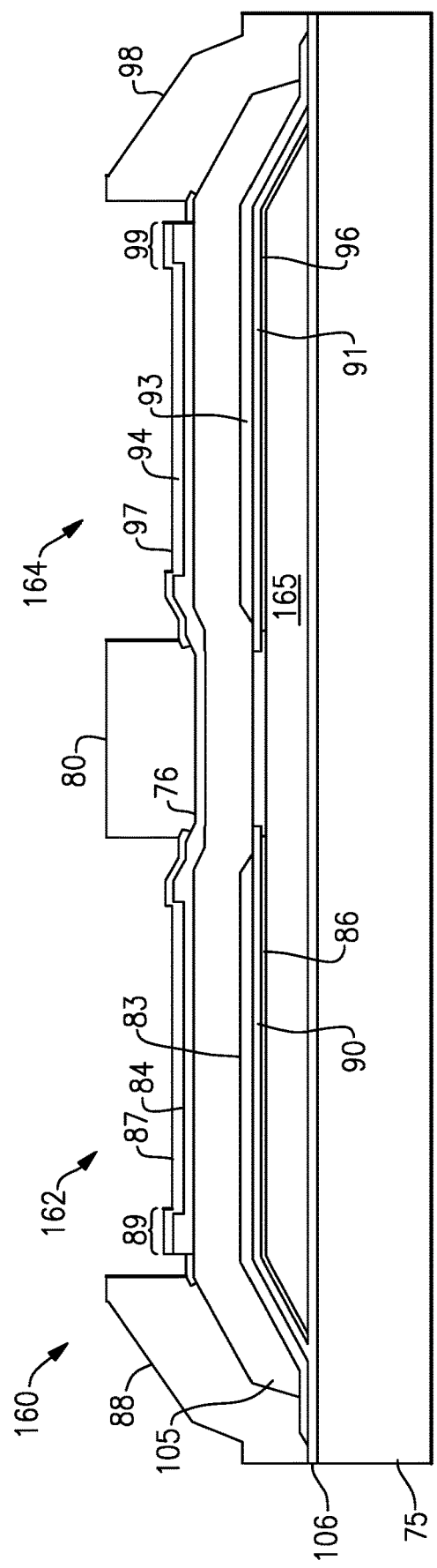
FIG. 14A is a cross sectional view of an acoustic wave component that includes anti-series BAW resonators that share an air cavity according to another embodiment.

FIG. 14A is a cross sectional view of an acoustic wave component 160 that includes anti-series BAW resonators that share an air cavity according to another embodiment. These anti-series BAW resonators can be included in an acoustic wave filter arranged to filter a radio frequency signal. The illustrated acoustic wave component 160 includes a first BAW resonator 162 and a second BAW resonator 164 electrically connected in anti-series with each other by the conductor 76. The acoustic wave component 160 is like the acoustic wave component 130 of FIG. 11A except that a common air cavity 165 is included in the acoustic wave component 160. The air cavity 165 is an air gap under the conductor 76. The air cavity 165 is between the conductor 76 and a surface of the substrate 75. The air cavity 165 is between the first electrodes 83 and 93 of the BAW resonators 162 and 164, respectively, and the surface of the substrate 75.

Figure 14B:
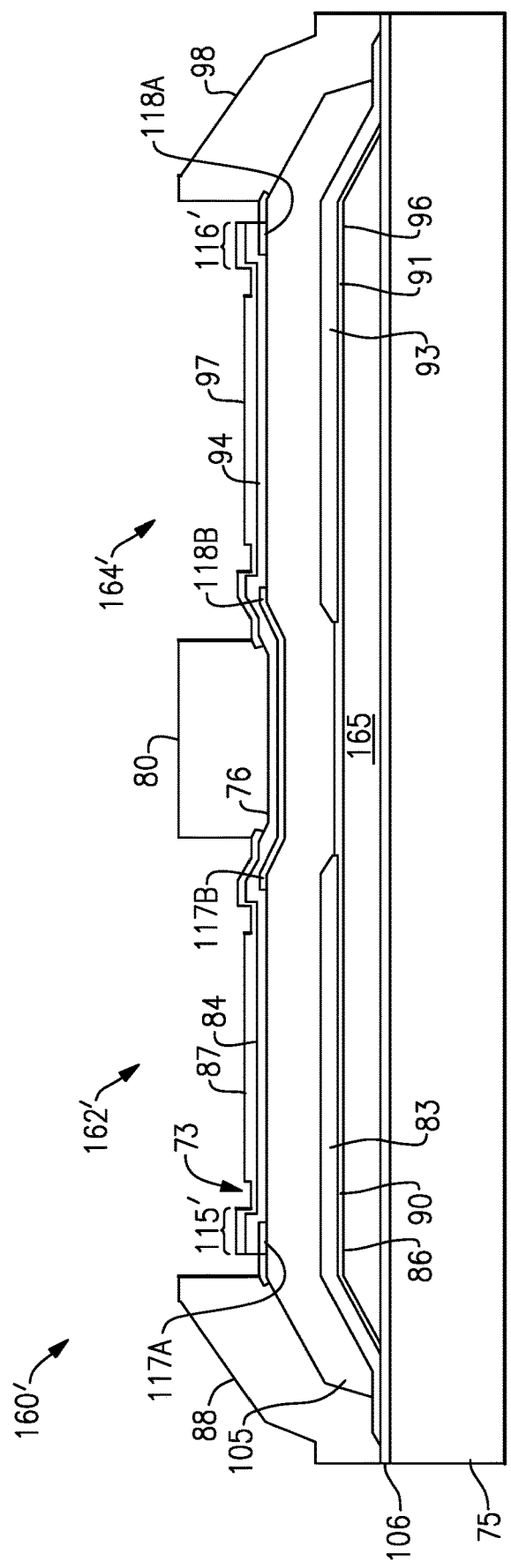
FIG. 14B is a cross sectional view of an acoustic wave component that includes anti-series BAW resonators that share an air cavity according to another embodiment.

FIG. 14B is a cross sectional view of an acoustic wave component 160' that includes anti-series BAW resonators that share an air cavity according to another embodiment. These anti-series BAW resonators can be included in an acoustic wave filter arranged to filter a radio frequency signal. The illustrated acoustic wave component 160' includes a first BAW resonator 162' and a second BAW resonator 164' electrically connected in anti-series with each other by the conductor 76. The air cavity 165 is an air gap under the conductor 76. The acoustic wave component 160' is like the acoustic wave component 160 of FIG. 14A except that the bulk acoustic wave resonators 162' and 164' include multi-layer raised frame structures 115 and 116, respectively, and recessed frame structures including the recessed frame structure 73 of the bulk acoustic wave resonator 162'. The multi-layer raised frame structures 115 and 116 of FIG. 14B are like the multi-layer raised frame structures 115 and 116 of FIGS. 8B and 11B.

Figure 15:
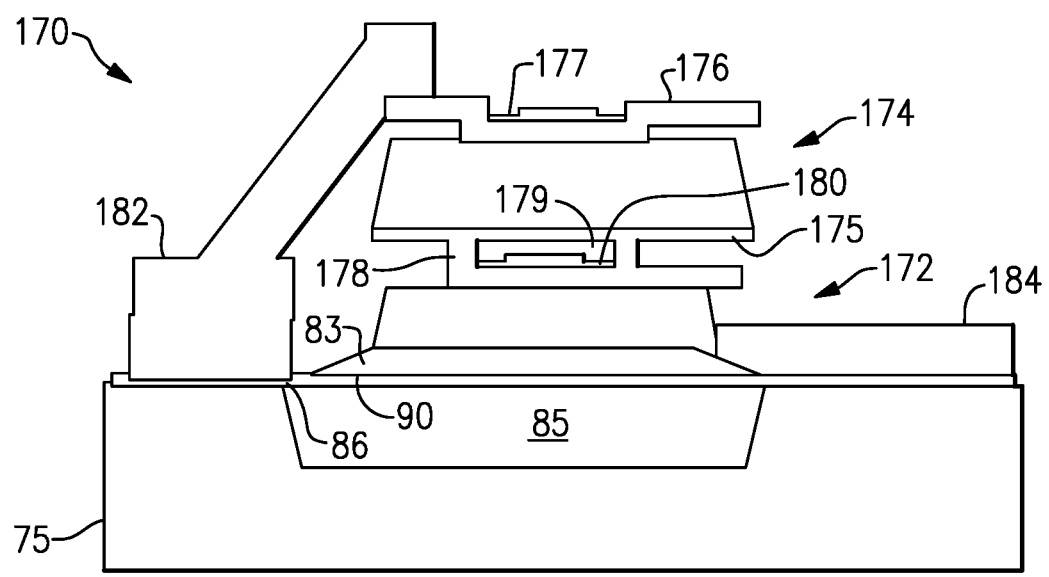
FIG. 15 is a cross sectional view of an acoustic wave component that includes vertically integrated anti-series BAW resonators according to an embodiment.

FIG. 15 is a cross sectional view of an acoustic wave component 170 that includes vertically integrated anti-series BAW resonators according to an embodiment. These anti-series BAW resonators can be included in an acoustic wave filter arranged to filter a radio frequency signal. The illustrated acoustic wave component 170 includes a first BAW resonator 172 and a second BAW resonator 174 electrically connected in anti-series with each other by a conductor 178. An air cavity 179 positioned between the first BAW resonator 172 and the second BAW resonator 174 is arranged to reduce parasitic capacitance associated with the electrical connection between the BAW resonators 172 and 174.

The vertically integrated anti-series BAW resonators 172 and 174 can be vertically integrated by the first BAW resonator 172 being formed on a first wafer, the second BAW resonator 174 being formed on a second wafer, and the two wafers being stacked on each other face to face with an air gap being formed between the two BAW resonators 172 and 174. In certain embodiments, the first wafer can include mostly and/or only series BAW resonators including the first BAW resonator 172 and the second wafer can include mostly shunt BAW resonators and the second BAW resonator 174.

The second BAW resonator 174 has a different geometry than other FBARs disclosed herein. The second BAW resonator 174 includes electrodes 175 and 176 on opposing sides of the piezoelectric layer 92. Passivation material 177 (e.g., silicon dioxide) can be included over the electrode 176.

Passivation material 180 (e.g., silicon dioxide) can be included over an electrode of the first BAW resonator 172. The air cavity 179 can be located between the passivation material 180 and an electrode of the second BAW resonator 174. Second metal layer contacts 182 and 184 provide electrical contacts to the vertically integrated anti-series BAW resonators 172 and 174.

Figure 16:
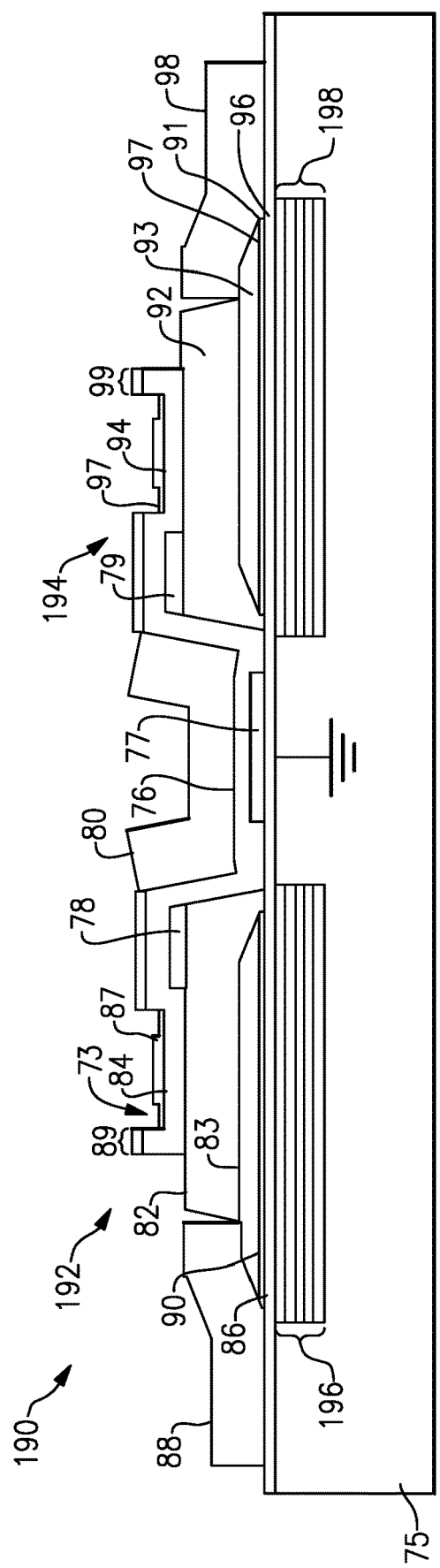
FIG. 16 is a cross sectional view of an acoustic wave component that includes anti-series solidly mounted BAW resonators with an air bridge below a conductor electrically connecting the anti-series BAW resonators according to an embodiment.

FIG. 16 is a cross sectional view of an acoustic wave component 190 that includes anti-series solidly mounted BAW resonators of an acoustic wave filter with an air bridge below a conductor electrically connecting the anti-series BAW resonators according to an embodiment. These anti-series BAW resonators can be included in an acoustic wave filter arranged to filter a radio frequency signal. The illustrated acoustic wave component 190 includes a first solidly mounted BAW resonator 192 and a second solidly mounted BAW resonator 194 electrically connected in anti-series with each other by the conductor 76. The acoustic wave component 190 is like the acoustic wave component 70 of FIG. 7A except that solid acoustic mirrors 196 and 198 are included in the acoustic wave component 190 in place of air cavities 85 and 95, respectively, of the acoustic wave component 70. Any suitable principles and advantages of the FBAR embodiments disclosed herein can be implemented in solidly mounted BAW resonator applications.

The solidly mounted BAW resonator 192 includes a solid acoustic mirror 196 located between the substrate 75 and the first electrode 83. The solid acoustic mirror 196 can include acoustic Bragg reflectors. The acoustic Bragg reflectors can include alternating low impedance and high impedance layers. As an example, the acoustic Bragg reflectors can include silicon dioxide layers and tungsten layers. As another example, the acoustic Bragg reflectors can include silicon dioxide layers and molybdenum layers. Any other suitable acoustic Bragg reflectors can alternatively or additionally be included in the acoustic mirror 196. The solid acoustic mirror 198 of the second solidly mounted BAW resonator 194 can be implemented similarly to the solid acoustic mirror 196 of the first solidly mounted BAW resonator 192.

The acoustic wave devices and/or acoustic wave filters with anti-series BAW resonators disclosed herein can be implemented in a variety of packaged modules. Some example packaged modules will now be discussed in which any suitable principles and advantages of the acoustic wave filters and/or acoustic wave devices disclosed herein can be implemented. The example packaged modules can include a package that encloses the illustrated circuit elements. The illustrated circuit elements can be disposed on a common packaging substrate. The packaging substrate can be a laminate substrate, for example. FIGS. 17 to 20 are schematic block diagrams of illustrative packaged modules according to certain embodiments. Any suitable combination of features of these packaged modules can be implemented with each other. While duplexers are illustrated in the example packaged modules of FIGS. 18 to 20, any other suitable multiplexer that includes a plurality of acoustic wave filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

Figure 17:
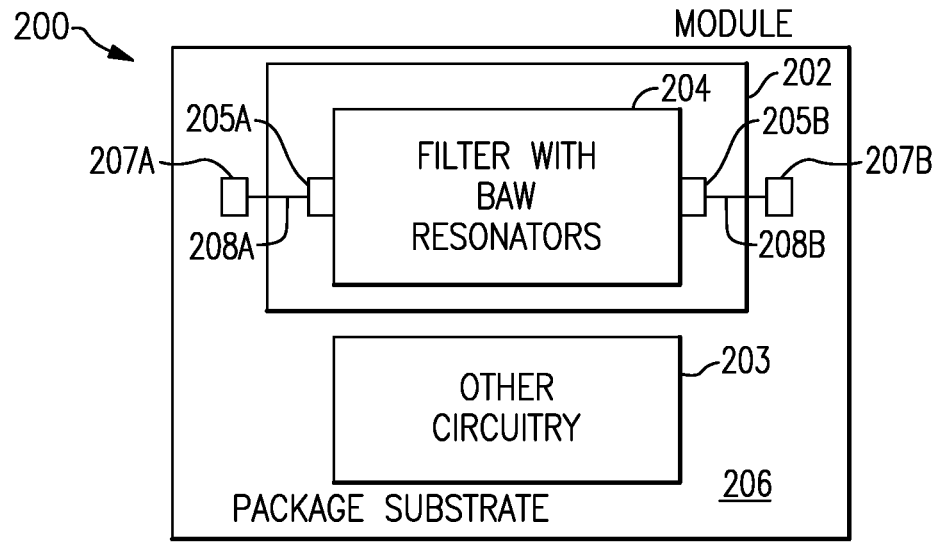
FIG. 17 is a schematic diagram of a radio frequency module that includes an acoustic wave filter according to an embodiment.

FIG. 17 is a schematic diagram of a radio frequency module 200 that includes an acoustic wave component 202 according to an embodiment. The illustrated radio frequency module 200 includes the acoustic wave component 202 and other circuitry 203. The acoustic wave component 202 can include anti-series BAW resonators in accordance with any suitable combination of features of the acoustic wave filters and/or resonators disclosed herein. The acoustic wave component 202 can include a BAW die that includes BAW resonators.

The acoustic wave component 202 shown in FIG. 17 includes a filter 204 and terminals 205A and 205B. The filter 204 includes BAW resonators implemented in accordance with any suitable principles and advantages of the filters and/or BAW resonators disclosed herein. The terminals 205A and 204B can serve, for example, as an input contact and an output contact. The acoustic wave component 202 and the other circuitry 203 are on a common packaging substrate 206 in FIG. 17. The package substrate 206 can be a laminate substrate. The terminals 205A and 205B can be electrically connected to contacts 207A and 207B, respectively, on the packaging substrate 206 by way of electrical connectors 208A and 208B, respectively. The electrical connectors 208A and 208B can be bumps or wire bonds, for example.

The other circuitry 203 can include any suitable additional circuitry. For example, the other circuitry can include one or more one or more radio frequency amplifiers (e.g., one or more power amplifiers and/or one or more low noise amplifiers), one or more power amplifiers, one or more radio frequency switches, one or more additional filters, one or more low noise amplifiers, one or more RF couplers, one or more delay lines, one or more phase shifters, the like, or any suitable combination thereof. The other circuitry 203 can be electrically connected to the filter 204. The radio frequency module 200 can include one or more packaging structures to, for example, provide protection and/or facilitate easier handling of the radio frequency module 200. Such a packaging structure can include an overmold structure formed over the packaging substrate 200. The overmold structure can encapsulate some or all of the components of the radio frequency module 200.

Figure 18:
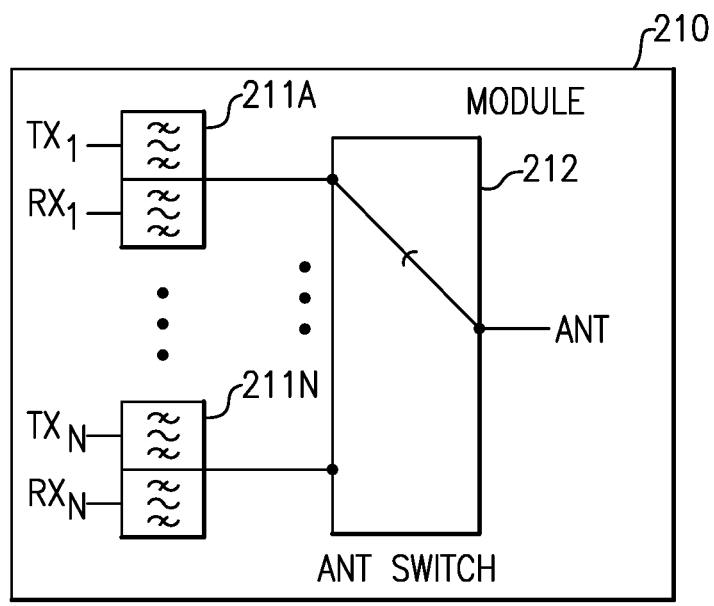
FIG. 18 is a schematic block diagram of a module that includes duplexers and an antenna switch according to an embodiment.

FIG. 18 is a schematic block diagram of a module 210 that includes duplexers 211A to 211N and an antenna switch 212. One or more filters of the duplexers 211A to 211N can include anti-series BAW resonators in accordance with any suitable principles and advantages discussed herein. Any suitable number of duplexers 211A to 211N can be implemented. The antenna switch 212 can have a number of throws corresponding to the number of duplexers 211A to 211N. The antenna switch 212 can include one or more additional throws coupled to one or more filters external to the module 210 and/or coupled to other circuitry. The antenna switch 212 can electrically couple a selected duplexer to an antenna port of the module 210.

Figure 19A:
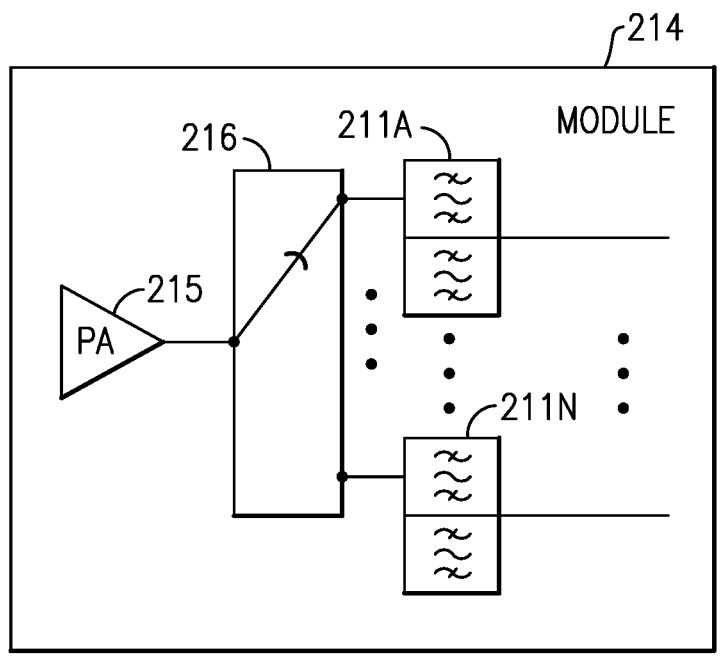
FIG. 19A is a schematic block diagram of a module that includes a power amplifier, a radio frequency switch, and duplexers according to an embodiment.

FIG. 19A is a schematic block diagram of a module 214 that includes a power amplifier 215, a radio frequency switch 216, and multiplexers 211A to 211N in accordance with one or more embodiments. The power amplifier 215 can amplify a radio frequency signal. The radio frequency switch 216 can be a multi-throw radio frequency switch. The radio frequency switch 216 can electrically couple an output of the power amplifier 215 to a selected transmit filter of the multiplexers 211A to 211N. One or more filters of the multiplexers 211A to 211N can include any suitable number of anti-series BAW resonators in accordance with any suitable principles and advantages discussed herein. Any suitable number of multiplexers 211A to 211N can be implemented.

Figure 19B:
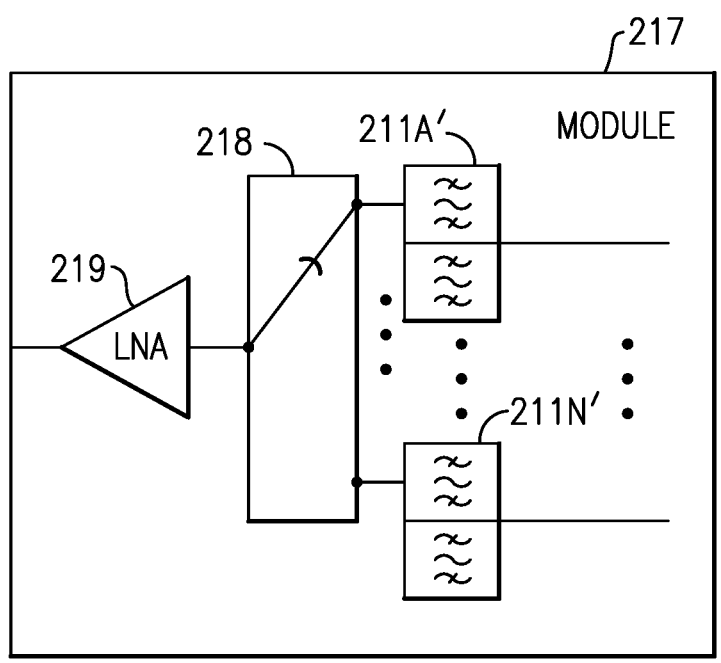
FIG. 19B is a schematic block diagram of a module that includes a low noise amplifier, a radio frequency switch, and duplexers according to an embodiment.

FIG. 19B is a schematic block diagram of a module 217 that includes multiplexers 211A' to 211N', a radio frequency switch 218', and a low noise amplifier 219 according to an embodiment. One or more filters of the multiplexers 211A' to 211N' can include any suitable number of anti-series BAW resonators in accordance with any suitable principles and advantages disclosed herein. Any suitable number of multiplexers 211A' to 211N' can be implemented. The radio frequency switch 218 can be a multi-throw radio frequency switch. The radio frequency switch 218 can electrically couple an output of a selected filter of multiplexers 211A' to 211N' to the low noise amplifier 219. In some embodiments (not illustrated), a plurality of low noise amplifiers can be implemented. The module 217 can include diversity receive features in certain applications.

Figure 20:
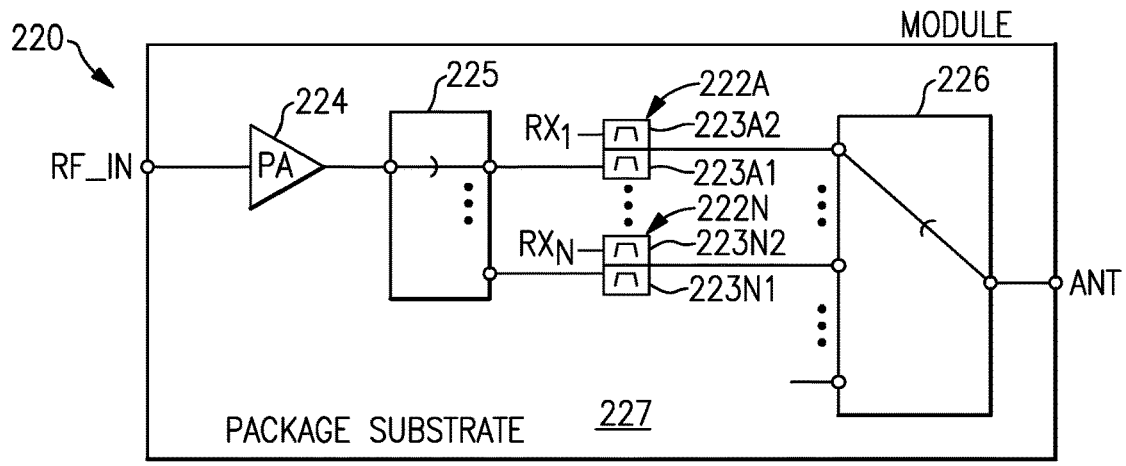
FIG. 20 is a schematic diagram of a radio frequency module that includes an acoustic wave filters according to an embodiment.

FIG. 20 is a schematic diagram of a radio frequency module 220 that includes an acoustic wave filter according to an embodiment. As illustrated, the radio frequency module 220 includes duplexers 222A to 222N that include respective transmit filters 223A1 to 223N1 and respective receive filters 223A2 to 223N2, a power amplifier 224, a select switch 225, and an antenna switch 226. The radio frequency module 220 can include a package that encloses the illustrated elements. The illustrated elements can be disposed on a common packaging substrate 227. The packaging substrate 227 can be a laminate substrate, for example. A radio frequency module that includes a power amplifier can be referred to as a power amplifier module. A radio frequency module can include a subset of the elements illustrated in FIG. 20 and/or additional elements. The radio frequency module 220 may include any one of the acoustic wave devices with anti-series BAW resonators in accordance with any suitable principles and advantages disclosed herein.

The duplexers 222A to 222N can each include two acoustic wave filters coupled to a common node. For example, the two acoustic wave filters can be a transmit filter and a receive filter, for example, as described with reference to FIGS. 1 and/or 5. As illustrated, the transmit filter and the receive filter can each be a band pass filter arranged to filter a radio frequency signal. One or more of the transmit filters 223A1 to 223N1 can include anti-series BAW resonators in accordance with any suitable principles and advantages disclosed herein. Similarly, one or more of the receive filters 223A2 to 223N2 can include anti-series BAW resonators in accordance with any suitable principles and advantages disclosed herein. Although FIG. 20 illustrates duplexers, any suitable principles and advantages disclosed herein can be implemented in other multiplexers (e.g., quadplexers, hexaplexers, octoplexers, etc.) and/or in switch-plexers.

The power amplifier 224 can amplify a radio frequency signal. The illustrated switch 225 is a multi-throw radio frequency switch. The switch 225 can electrically couple an output of the power amplifier 224 to a selected transmit filter of the transmit filters 223A1 to 223N1. In some instances, the switch 225 can electrically connect the output of the power amplifier 224 to more than one of the transmit filters 223A1 to 223N1. The antenna switch 226 can selectively couple a signal from one or more of the duplexers 222A to 222N to an antenna port ANT. The duplexers 222A to 222N can be associated with different frequency bands and/or different modes of operation (e.g., different power modes, different signaling modes, etc.).

Figure 21A:
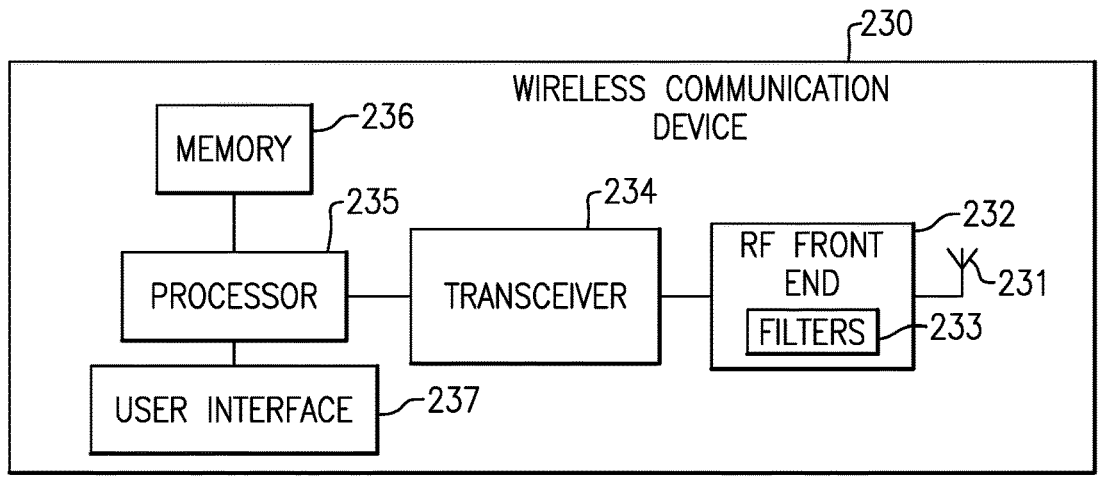
FIG. 21A is a schematic block diagram of a wireless communication device that includes a filter in accordance with one or more embodiments.

The filters with anti-series BAW resonators disclosed herein can be implemented in a variety of wireless communication devices. FIG. 21A is a schematic diagram of a wireless communication 230 device that includes filters 233 in a radio frequency front end 232 according to an embodiment. One or more of the filters 233 can include anti-series BAW resonators in accordance with any suitable principles and advantages disclosed herein. The wireless communication device 230 can be any suitable wireless communication device. For instance, a wireless communication device 230 can be a mobile phone, such as a smart phone. As illustrated, the wireless communication device 230 includes an antenna 231, an RF front end 232, a transceiver 234, a processor 235, a memory 236, and a user interface 237. The antenna 231 can transmit RF signals provided by the RF front end 232. Such RF signals can include carrier aggregation signals. The antenna 231 can receive RF signals and provide the received RF signals to the RF front end 232 for processing. The user equipment 230 can include two or more antennas in certain instances.

The RF front end 232 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 232 can transmit and receive RF signals associated with any suitable communication standards. One or more of the filters 233 can include anti-series BAW resonators that include any suitable combination of features of the embodiments discussed above.

The transceiver 234 can provide RF signals to the RF front end 232 for amplification and/or other processing. The transceiver 234 can also process an RF signal provided by a low noise amplifier of the RF front end 232. The transceiver 234 is in communication with the processor 235. The processor 235 can be a baseband processor. The processor 235 can provide any suitable base band processing functions for the wireless communication device 230. The memory 236 can be accessed by the processor 235. The memory 236 can store any suitable data for the wireless communication device 230. The user interface 237 can be any suitable user interface, such as a display with touch screen capabilities.

Figure 21B:
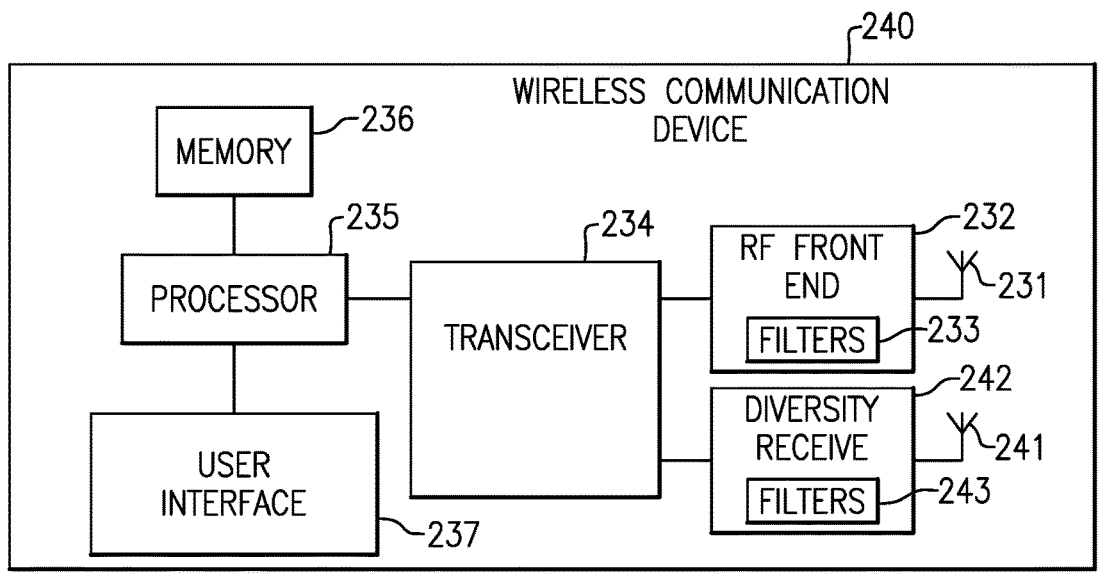
FIG. 21B is a schematic block diagram of another wireless communication device that includes a filter in accordance with one or more embodiments.

FIG. 21B is a schematic diagram of a wireless communication device 240 that includes filters 233 in a radio frequency front end 232 and second filters 243 in a diversity receive module 242. The wireless communication device 240 is like the wireless communication device 230 of FIG. 21A, except that the wireless communication device 240 also includes diversity receive features. As illustrated in FIG. 21B, the wireless communication device 240 includes a diversity antenna 241, a diversity module 242 configured to process signals received by the diversity antenna 241 and including filters 243, and a transceiver 234 in communication with both the radio frequency front end 232 and the diversity receive module 242. One or more of the second filters 243 can include anti-series BAW resonators in accordance with any suitable principles and advantages disclosed herein. The diversity module 242 can be considered part of a radio frequency front end.

Figure 22:
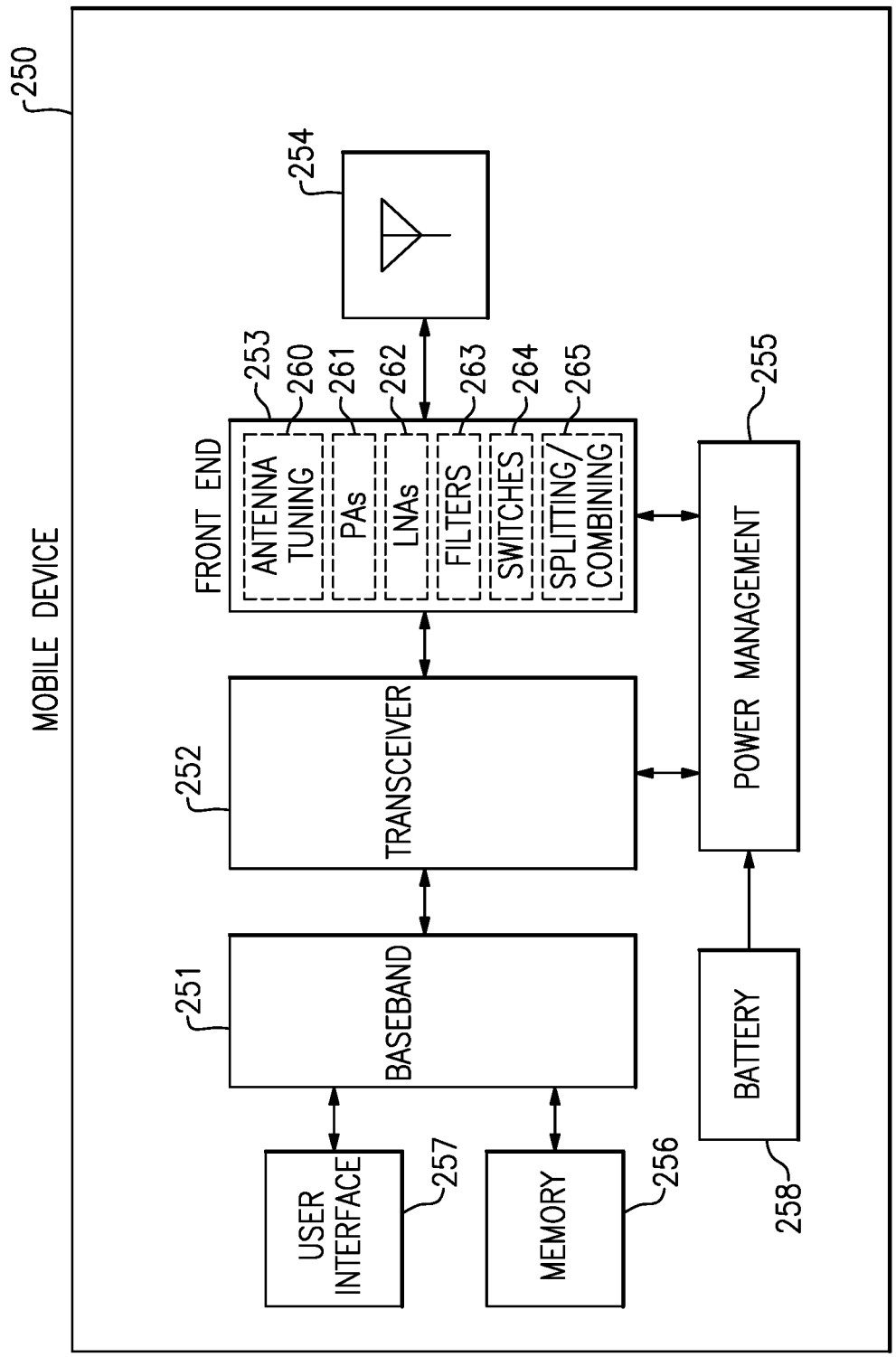
FIG. 22 is a schematic diagram of an embodiment of a mobile device.

FIG. 22 is a schematic diagram of one embodiment of a mobile device 250. The mobile device 250 includes a baseband system 251, a transceiver 252, a front end system 253, antennas 254, a power management system 255, a memory 256, a user interface 257, and a battery 258.

The mobile device 250 can be used communicate using a wide variety of communications technologies, including, but not limited to, second generation (2G), third generation (3G), fourth generation (4G) (including LTE, LTE-Advanced, and LTE-Advanced Pro), fifth generation (5G) New Radio (NR), wireless local area network (WLAN) (for instance, WiFi), wireless personal area network (WPAN) (for instance, Bluetooth and ZigBee), WMAN (wireless metropolitan area network) (for instance, WiMax), Global Positioning System (GPS) technologies, or any suitable combination thereof.

The transceiver 252 generates RF signals for transmission and processes incoming RF signals received from the antennas 254. It will be understood that various functionalities associated with the transmission and receiving of RF signals can be achieved by one or more components that are collectively represented in FIG. 22 as the transceiver 252. In one example, separate components (for instance, separate circuits or dies) can be provided for handling certain types of RF signals.

The front end system 253 aids in conditioning signals transmitted to and/or received from the antennas 254. In the illustrated embodiment, the front end system 253 includes antenna tuning circuitry 260, power amplifiers (PAs) 261, low noise amplifiers (LNAs) 262, filters 263, switches 264, and signal splitting/combining circuitry 265. However, other implementations are possible. One or more of the filters 263 can be implemented in accordance with any suitable principles and advantages disclosed herein.

For example, the front end system 253 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or any suitable combination thereof.

In certain implementations, the mobile device 250 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 254 can include antennas used for a wide variety of types of communications. For example, the antennas 254 can include antennas for transmitting and/or receiving signals associated with a wide variety of frequencies and communications standards.

In certain implementations, the antennas 254 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 250 can operate with beamforming in certain implementations. For example, the front end system 253 can include amplifiers having controllable gain and phase shifters having controllable phase to provide beam formation and directivity for transmission and/or reception of signals using the antennas 254. For example, in the context of signal transmission, the amplitude and phases of the transmit signals provided to the antennas 254 are controlled such that radiated signals from the antennas 254 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 254 from a particular direction. In certain implementations, the antennas 254 include one or more arrays of antenna elements to enhance beamforming.

The baseband system 251 is coupled to the user interface 257 to facilitate processing of various user input and output (I/O), such as voice and data. The baseband system 251 provides the transceiver 252 with digital representations of transmit signals, which the transceiver 252 processes to generate RF signals for transmission. The baseband system 251 also processes digital representations of received signals provided by the transceiver 252. As shown in FIG. 22, the baseband system 251 is coupled to the memory 256 of facilitate operation of the mobile device 250.

The memory 256 can be used for a wide variety of purposes, such as storing data and/or instructions to facilitate the operation of the mobile device 250 and/or to provide storage of user information.

The power management system 255 provides a number of power management functions of the mobile device 250. In certain implementations, the power management system 255 includes a PA supply control circuit that controls the supply voltages of the power amplifiers 261. For example, the power management system 255 can be configured to change the supply voltage(s) provided to one or more of the power amplifiers 261 to improve efficiency, such as power added efficiency (PAE).

As shown in FIG. 22, the power management system 255 receives a battery voltage from the battery 258. The battery 258 can be any suitable battery for use in the mobile device 250, including, for example, a lithium-ion battery.

Technology disclosed herein can be implemented in acoustic wave filters in fifth generation (5G) applications. 5G technology is also referred to herein as 5G New Radio (NR). 5G NR supports and/or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR. An acoustic wave device including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more SAW devices disclosed herein. FR1 can be from 410 MHz to 7.125 GHz, for example, as specified in a current 5G NR specification. One or more acoustic wave devices in accordance with any suitable principles and advantages disclosed herein can be included in a filter arranged to filter a radio frequency signal in a 4G LTE operating band and/or in a filter having a passband that includes a fourth generation (4G) Long Term Evolution (LTE) operating band and a 5G NR operating band.

The acoustic wave filters disclosed herein can suppress second harmonics. Such features can be advantageous in 5G NR applications. Suppressing second harmonics can provide increased filter linearity. With higher filter linearity, higher peak to average power ratios that are present in certain 5G NR applications can be accommodated. Suppression of harmonics and/or higher filter linearity can be advantageous for meeting one or more other specifications in 5G technology.

Figure 23:
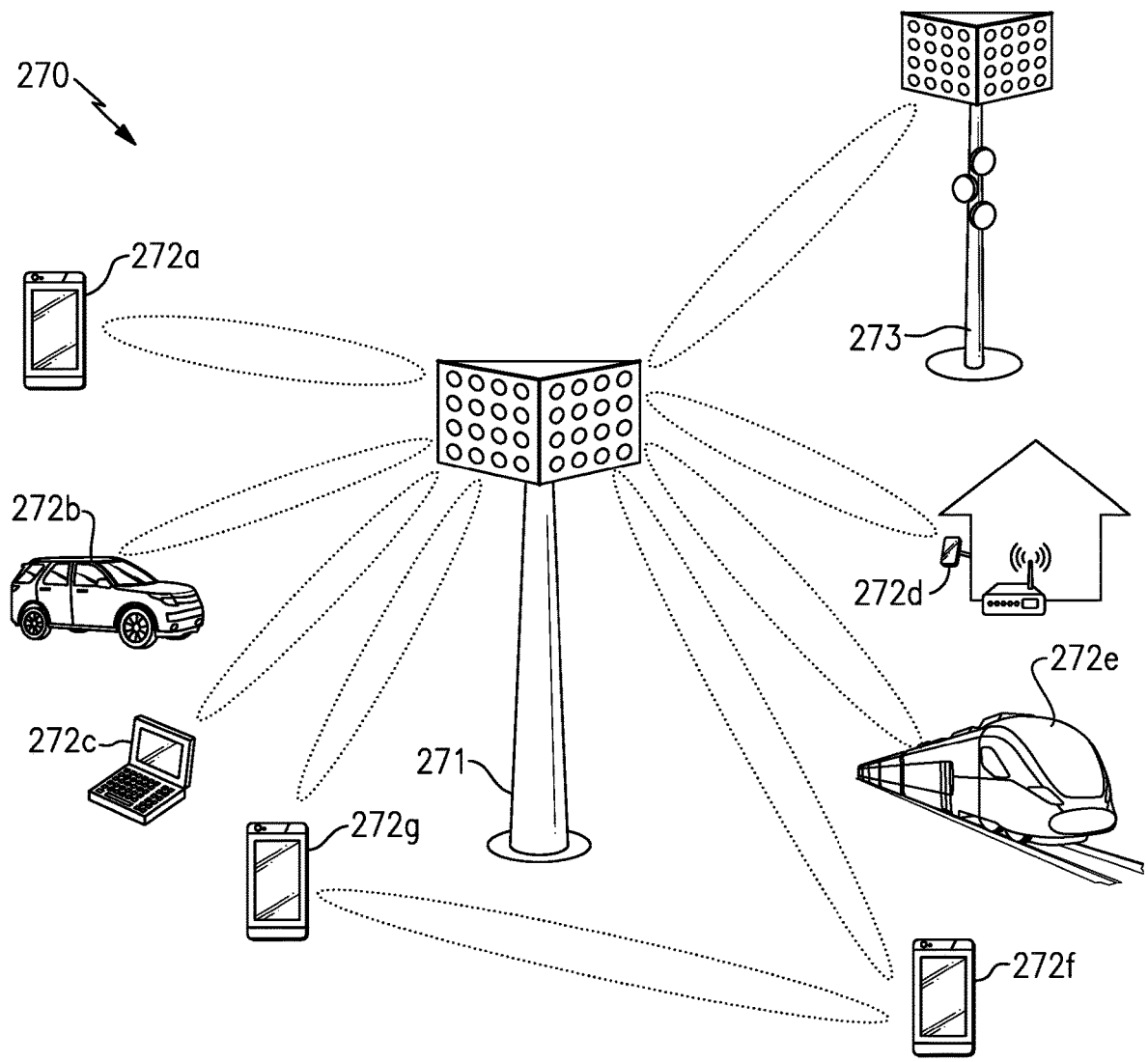
FIG. 23 is a schematic diagram of an example of a communication network.

FIG. 23 is a schematic diagram of one example of a communication network 270. The communication network 270 includes a macro cell base station 271, a small cell base station 273, and various examples of user equipment (UE), including a first mobile device 272a, a wireless-connected car 272b, a laptop 272c, a stationary wireless device 272d, a wireless-connected train 272e, a second mobile device 272f, and a third mobile device 272g. UEs are wireless communication devices. One or more of the macro cell base station 141, the small cell base station 273, or UEs illustrated in FIG. 23 can implement one or more of the acoustic wave filters in accordance with any suitable principles and advantages disclosed herein. For example, one or more of the UEs shown in FIG. 23 can include an acoustic wave filter that includes a first bulk acoustic wave resonator, a second bulk acoustic wave resonator, a conductor electrically connecting the first bulk acoustic wave resonator in anti-series with the second bulk acoustic wave resonator, and an air gap positioned between the conductor and a substrate.

Although specific examples of base stations and user equipment are illustrated in FIG. 23, a communication network can include base stations and user equipment of a wide variety of types and/or numbers. For instance, in the example shown, the communication network 270 includes the macro cell base station 271 and the small cell base station 273. The small cell base station 273 can operate with relatively lower power, shorter range, and/or with fewer concurrent users relative to the macro cell base station 271. The small cell base station 273 can also be referred to as a femtocell, a picocell, or a microcell. Although the communication network 270 is illustrated as including two base stations, the communication network 270 can be implemented to include more or fewer base stations and/or base stations of other types.

Although various examples of user equipment are shown, the teachings herein are applicable to a wide variety of user equipment, including, but not limited to, mobile phones, tablets, laptops, Internet of Things (IoT) devices, wearable electronics, customer premises equipment (CPE), wirelessly-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 270 of FIG. 23 supports communications using a variety of cellular technologies, including, for example, 4G LTE and 5G NR. In certain implementations, the communication network 270 is further adapted to provide a wireless local area network (WLAN), such as WiFi. Although various examples of communication technologies have been provided, the communication network 270 can be adapted to support a wide variety of communication technologies.

Various communication links of the communication network 270 have been depicted in FIG. 23. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 23, the communication links include not only communication links between UE and base stations, but also UE to UE communications and base station to base station communications. For example, the communication network 270 can be implemented to support self-fronthaul and/or self-backhaul (for instance, as between mobile device 272g and mobile device 272f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. According to certain implementations, the communication links can serve Frequency Range 1 (FR1), Frequency Range 2 (FR2), or a combination thereof. An acoustic wave filter in accordance with any suitable principles and advantages disclosed herein can filter a radio frequency signal within FR1. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 270 can share available network resources, such as available frequency spectrum, in a wide variety of ways. In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 270 of FIG. 23 can be used to support a wide variety of advanced communication features, including, but not limited to, eMBB, uRLLC, and/or mMTC.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz. Acoustic wave filters disclosed herein can filter RF signals at frequencies up to an upper end of FR1. Acoustic wave filters disclosed herein can filter RF signals at frequencies up to about 10 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, structures, modules, apparatus, methods, and systems described herein may be embodied in a variety of other forms. Furthermore, various omissions, substitutions and changes in the form of the resonators, structures, modules, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An acoustic wave filter with second harmonic suppression, the acoustic wave filter comprising:
    a first film bulk acoustic wave resonator on a substrate, the first film bulk acoustic wave resonator including a first air cavity;
    a second film bulk acoustic wave resonator on the substrate, the second film bulk acoustic wave resonator including a second air cavity;
    a conductor electrically connecting the first film bulk acoustic wave resonator in anti-series with the second film bulk acoustic wave resonator;
    a metal layer positioned such that the conductor is located between the metal layer and the substrate; and
    an air gap positioned between the conductor and a surface of the substrate, the air gap is non-overlapping with both the first and second air cavities, and the acoustic wave filter configured to filter a radio frequency signal.

2. The acoustic wave filter of claim 1 wherein the air gap is an air cavity in the substrate.

3. The acoustic wave filter of claim 1 wherein the air gap is an air cavity positioned between a layer of piezoelectric material and the substrate.

4. The acoustic wave filter of claim 1 wherein the air gap is an air bridge over the substrate.

5. The acoustic wave filter of claim 1 wherein the air gap is an air bridge positioned between a layer of piezoelectric material and the conductor.

6. The acoustic wave filter of claim 1 wherein the acoustic wave filter is a transmit filter having an antenna port, and the first film bulk acoustic wave resonator and the second film bulk acoustic wave resonator are coupled between all other series bulk acoustic wave resonators of the acoustic wave filter and the antenna port.

7. The acoustic wave filter of claim 1 wherein the first film bulk acoustic wave resonator includes a multi-layer raised frame structure.

8. The acoustic wave filter of claim 7 wherein the first film bulk acoustic wave resonator includes a recessed frame structure.

9. An acoustic wave filter with second harmonic suppression, the acoustic wave filter comprising:
    a first film bulk acoustic wave resonator on a substrate, the first film bulk acoustic wave resonator including a first air cavity;
    a second film bulk acoustic wave resonator on the substrate, the second film bulk acoustic wave resonator including a second air cavity;
    a conductor electrically connecting the first film bulk acoustic wave resonator in anti-series with the second film bulk acoustic wave resonator;
    an air gap positioned between the conductor and a surface of the substrate, the air gap is non-overlapping with both the first and second air cavities; and
    a second air gap positioned between the conductor and the substrate, the air gap being an air cavity, the second air gap being an air bridge, and the acoustic wave filter configured to filter a radio frequency signal.

10. The acoustic wave filter of claim 9 further comprising a metal layer positioned such that the conductor is located between the metal layer and the substrate.

11. A multiplexer arranged to filter radio frequency signals, the multiplexer comprising:

a first acoustic wave filter configured to filter a first radio frequency signal, the first acoustic wave filter including a first film bulk acoustic wave resonator on a substrate, a second film bulk acoustic wave resonator on the substrate, a conductor electrically connecting the first film bulk acoustic wave resonator in anti-series with the second film bulk acoustic wave resonator, a metal layer positioned such that the conductor is located between the metal layer and the substrate, and an air gap positioned between the conductor and a surface of the substrate, the first film bulk acoustic wave resonator including a first air cavity, the second film bulk acoustic wave resonator including a second air cavity, and the air gap is non-overlapping with both the first and second air cavities; and a second acoustic wave filter configured to filter a second radio frequency signal, the second acoustic wave filter coupled to the first acoustic wave filter at a common node of the multiplexer.

12. The multiplexer of claim 11 wherein the first film bulk acoustic wave resonator includes a multi-layer raised frame structure.

13. The multiplexer of claim 11 further comprising a third acoustic wave filter configured to filter a third radio frequency signal, the third acoustic wave filter coupled to both the first acoustic wave filter and the second acoustic wave filter at the common node.

14. The multiplexer of claim 11 wherein the metal layer is in physical contact with the conductor.

15. The multiplexer of claim 11 wherein the first film bulk acoustic wave resonator includes a recessed frame structure.

16. The multiplexer claim 11 further comprising a second air gap positioned between the conductor and the substrate, the air gap being an air cavity, and the second air gap being an air bridge.

17. A method of filtering a radio frequency signal with second harmonic suppression, the method comprising:

providing a radio frequency signal to an acoustic wave filter that includes an air gap between a conductor of the acoustic wave filter and a substrate, the conductor electrically connecting a first film bulk acoustic wave resonator of the acoustic wave filter in anti-series with a second film bulk acoustic wave resonator of the acoustic wave filter, the conductor being located between a metal layer and the substrate, the first film bulk acoustic wave resonator and the second film bulk acoustic wave resonator both being on the substrate, the first film bulk acoustic wave resonator including a first air cavity, the second film bulk acoustic wave resonator including a second air cavity, and the air gap is non-overlapping with both the first and second air cavities; and filtering the radio frequency signal with the acoustic wave filter so as to provide second harmonic suppression.

18. The method of claim 17 wherein the acoustic wave filter is a transmit filter.

19. The method of claim 18 wherein the transmit filter has an antenna port, and the first film bulk acoustic wave resonator and the second film bulk acoustic wave resonator are coupled between all other series bulk acoustic wave resonators of the acoustic wave filter and the antenna port.

20. The method of claim 18 wherein the transmit filter is included in a multiplexer, and the transmit filter is coupled to a receive filter of the multiplexer at a common node of the multiplexer.

* * * * *